(12) United States Patent
Tsuji

(10) Patent No.: US 6,898,113 B2
(45) Date of Patent: May 24, 2005

(54) MAGNETIC MEMORY DEVICE WITH REFERENCE CELL FOR DATA READING

(75) Inventor: Takaharu Tsuji, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 131 days.

(21) Appl. No.: 10/628,463

(22) Filed: Jul. 29, 2003

(65) Prior Publication Data

US 2004/0165419 A1 Aug. 26, 2004

(30) Foreign Application Priority Data

Feb. 20, 2003 (JP) .......................................... 2003-042230

(51) Int. Cl.$^7$ .............................................. G11C 11/00
(52) U.S. Cl. ........................ 365/158; 365/209; 365/210
(58) Field of Search ................................. 365/200, 209, 365/210, 158

(56) References Cited

U.S. PATENT DOCUMENTS 6,055,178 A  4/2000  Naji
6,754,099 B2 * 6/2004 Hidaka ........................ 365/173
6,788,568 B2 * 9/2004 Hidaka ........................ 36/158

FOREIGN PATENT DOCUMENTS

JP        2002-222589        8/2002

OTHER PUBLICATIONS

U.S. Appl. No. 10/260,397, filed Oct. 1, 2002, Tanizaki et al.

* cited by examiner

*Primary Examiner*—Son Mai
(74) *Attorney, Agent, or Firm*—McDermott Will & Emery LLP

(57) ABSTRACT

In a normal data reading, one of word lines and one of first and second dummy word lines are selected and data is read out through the access to selected regular memory cell and a reference cell. In a test mode, each of word lines are turned to a non-select state and both of first and second dummy word lines are selected and by setting one of first and second reference voltages to a level different from a level during the normal data reading, data is read out through the access to the reference cells.

10 Claims, 15 Drawing Sheets

|  | TEST PATTERN | | | |
|---|---|---|---|---|
| TEST CONTROL SIGNAL | i) | ii) | iii) | iv) |
| DTEST0 | H | L | L | L |
| DTEST1 | L | H | L | L |
| SDTEST0 | L | L | H | L |
| SDTEST1 | L | L | L | H |

REFERENCE CELL TEST MODE (i, ii)

SPARE REFERENCE CELL TEST MODE (iii, iv)

FIG.21A

NO DEFECT (FOR BOTH REGULAR MEMORY CELL & REFERENCE MEMORY CELL)

| RAdd(0) | WL0,2,4,6,··· | WL1,3,5,··· | DWL0 | DWL1 | SDWL0 | SDWL1 |
|---|---|---|---|---|---|---|
| 0(L) | SELECT | NON-SELECT | NON-SELECT | SELECT | NON-SELECT | NON-SELECT |
| 1(H) | NON-SELECT | SELECT | SELECT | NON-SELECT | NON-SELECT | NON-SELECT |

FIG.21B

REPLACEMENT OF REGULAR MEMORY CELL (REGULAR WORD LINE)

| RAdd(0) | WL0,2,4,6,··· | WL1,3,5,··· | DWL0 | DWL1 | SDWL0 | SDWL1 |
|---|---|---|---|---|---|---|
| 0(L) | SELECT | NON-SELECT | NON-SELECT | SELECT | SELECT | NON-SELECT |
| 1(H) | NON-SELECT | SELECT | SELECT | NON-SELECT | NON-SELECT | SELECT |

(NON-SELECTION OF DEFECTIVE WL ONLY)  (ONLY WHEN DEFECTIVE WL IS SELECTED)

FIG.21C

REPLACEMENT OF REFERENCE CELL (DUMMY WORD LINE)

| RAdd(0) | WL0,2,4,6,··· | WL1,3,5,··· | DWL0 | DWL1 | SDWL0 | SDWL1 |
|---|---|---|---|---|---|---|
| 0(L) | SELECT | NON-SELECT | NON-SELECT | NON-SELECT | NON-SELECT | SELECT |
| 1(H) | NON-SELECT | SELECT | NON-SELECT | NON-SELECT | SELECT | NON-SELECT |

MAGNETIC MEMORY DEVICE WITH REFERENCE CELL FOR DATA READING

BACKGROUND OF THE INVENTION

1. Field of the Invention

The present invention relates to magnetic memory devices, and particularly to magnetic memory devices which perform data reading based on a comparison of the results obtained from the access to a regular magnetic memory cell and a reference cell.

2. Description of the Background Art

Magnetic random access memory devices (MRAM devices) include an element having tunneling magnetoresistive (TMR) effect (hereinafter referred to as a "tunneling magneto-resistance element") as a memory cell. The tunneling magneto-resistance element has a magnetic tunnel junction structure and includes a first magnetic thin film with a fixed direction of magnetization, a second magnetic thin film with a direction of magnetization which is rewritable through an external application of magnetic field and a tunneling insulation film interposed between the first and the second magnetic thin films.

The tunneling magneto-resistance element is characterized in that the resistance thereof takes a minimum value Rmin and a maximum value Rmax when directions of magnetic moments of the first and the second magnetic thin films are parallel and anti-parallel (opposite), respectively. Hence, in a magnetic memory cell (hereinafter also referred to as an "MTJ memory cell") with a tunneling magneto-resistance element, the parallel state of the magnetic moments (low resistance state) and the anti-parallel state (high resistance state) of the magnetic moments in the tunneling magneto-resistance element correspond with logic levels "0" and "1" of stored data.

Data stored in the MTJ memory cell is held in a non-volatile manner until it is rewritten by the application of a data-writing magnetic field which exceeds a threshold level, at which level the inversion of the direction of magnetization of the magnetic thin film can be occurred. Generally, in the MRAM devices, random access is implemented with a digit line as a write select line and a word line as a read select line both provided corresponding to a row of the MTJ memory cell and a bit line as a data line provided corresponding to a column of the MTJ memory cell. Thus, the MTJ memory cell is arranged corresponding to the intersection of the bit line and the word line/digit line.

At the time of data reading, according to a word line selection, a MTJ memory cell is selected and a tunneling magneto-resistance element in the selected MTJ memory cell (hereinafter referred to as a "selected memory cell") is electrically connected between a corresponding bit line and a source line. In this state, a potential difference is created between the bit line and the source line thereby producing a current which passes through the MTJ memory cell (hereinafter referred to as a "memory cell current"). The memory cell current, in other words, a current passing through the bit line is detected and data stored in the selected memory cell is read out. More specifically, it is necessary to detect whether the memory cell current is a passing current Imin of an MTJ memory cell which stores data corresponding to the resistance Rmax or a passing current Imax of an MTJ memory cell which stores data corresponding to the resistance Rmin.

A technique is disclosed, for example in Japanese Patent Laying-Open No. 2002-222589 (hereinafter, referred to as a "cited publication"), for utilizing a reference cell having a tunneling magneto-resistance element, to generate a reference current to be compared with the passing current of a MTJ memory cell.

The reference current must be set to an intermediate value of the two different memory cell currents Imax and Imin mentioned above. Thus, it is advantageous to generate the reference current using the tunneling magneto-resistance element, which is similar to the MTJ memory cell, as the reference current then can easily be set to an appropriate level.

In the configuration as described above, where the data reading is performed according to the comparison between the passing currents of the selected memory cell and the reference cell, a normal data reading cannot be performed when the reference cell becomes defective.

However, a general procedure for the conventional operation test is, first, writing data of a predetermined pattern to a regular MTJ memory cell as a test, and then checking if the data read out after the test writing matches with a value expected based on the predetermined pattern. In such operation test, when the read data does not match with the expected value, it is difficult to identify either of the regular MTJ memory cell or the reference cell is defective. In particular, when data is read in the similar manner as in the normal operation, it is difficult to test whether the reference cell itself which generates the reference current is defective or not.

The above cited publication discloses a configuration where a reference bit line dedicated for a reference cell can be replaced with a spare reference bit line. However, as the test of the reference cell itself is difficult to perform, it is difficult to correctly determine whether the replacement of the reference bit line with the spare is necessary or not.

Thus, when it cannot be determined which of the regular MTJ memory cell and the reference cell has become defective, effective replacement of a defective memory cell and hence an improvement of the yield of the production of the MRAM device is difficult to achieve.

SUMMARY OF THE INVENTION

An object of the present invention is to provide a magnetic memory device with a test mode to test a reference cell itself which generates a reference current for data reading.

The magnetic memory device according to the present invention includes: a plurality of word lines and a plurality of dummy word lines arranged along a same direction; a plurality of bit line pairs each formed with a first and second bit lines arranged in a direction perpendicular to the direction of the plurality of word lines and the plurality of dummy word lines; a plurality of magnetic memory cells alternately arranged at intersections of the plurality of word lines and the first and second bit lines, and electrically connected with the corresponding first or second bit line in response to a selection of the corresponding word line; a plurality of magnetic reference cells alternately arranged at the intersections of the plurality of dummy word lines and the first and second bit lines, and electrically connected to the corresponding first or second bit line in response to a selection of the corresponding dummy word line; a data reading circuit performing a data reading based on a passing current of the first and second bit lines forming same bit line pair; and a row select unit controlling a selection of the plurality of word lines and the plurality of dummy word lines according to an address signal, wherein the row select unit selects one of the plurality of word lines and one of the plurality of dummy word lines in a normal data reading such that the first and second bit lines forming each of the bit line pairs are connected to one of the plurality of magnetic memory cells and one of the plurality of magnetic reference cells, respectively, and sets each of the plurality of word lines to a non-select state and at the same time selects the plurality of dummy word lines in a first test mode such that the first and second bit lines forming each of the bit line pairs are connected to two of the plurality of magnetic reference cells, respectively.

Thus, a main advantage of the present invention lies in that it is possible to check whether each reference cell itself is defective or not, as a test mode is provided in which data is read through access to reference cells, which are set such that a predetermined difference will be generated between the currents passing through these reference cells when the characteristics of these cells are normal. As a result, effective replacement can be achieved particularly at a time when a plurality of reference cells become defective.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 21A–21C are diagrams illustrative of row selection according to a variation of the third embodiment.

DESCRIPTION OF THE PREFERRED EMBODIMENTS

Figure 1:
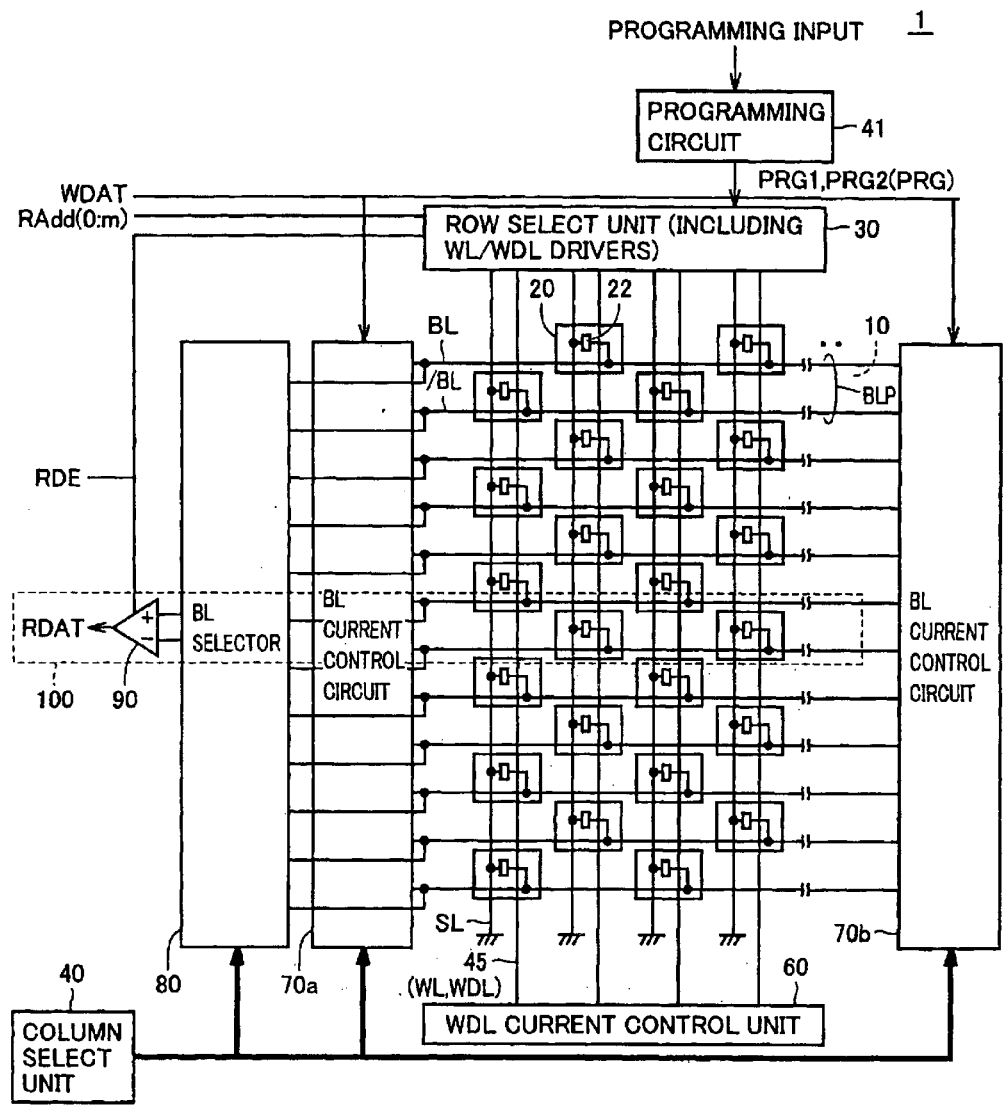
FIG. 1 is a block diagram showing an overall configuration of an MRAM device according to an embodiment of the present invention.

Hereinafter the embodiments of the present invention will be described in detail with reference to the drawings. In the drawings, same parts and components are indicated by the same character.

First Embodiment (Overall Configuration of MRAM)

First, an overall configuration of an MRAM device will be described, followed by a description of the configuration according to the first embodiment.

With reference to FIG. 1, an MRAM device 1 according to an embodiment of the present invention includes, a memory cell array 10, a row select unit 30, a column select unit 40, a programming circuit 41, a write digit line current control unit (WDL current control unit) 60, bit line current control circuits (BL current control circuits) 70a and 70b, a bit line selector (BL selector) 80 and a data reading amplifier 90.

Memory cell array 10 includes a plurality of MTJ memory cells 20's (hereinafter also referred to as a "regular memory cell") to be selected according to a row address signal RAdd and a column address signal CAdd. As will be described in detail later, in memory cell array 10, a plurality of reference cells for generating a reference current Iref and spare cells to be replaced with the plurality of reference cells are further arranged.

Regular memory cell 20 each includes a tunneling magneto-resistance element 22. The resistance of tunneling magneto-resistance element 22 changes according to data magnetically written therein. The resistance of the MTJ memory cell changes either to Rmin (low resistance state) or Rmax (high resistance state) according to stored data. In the following, the difference between resistance Rmax and resistance Rmin is also denoted as resistance difference ΔR (ΔR=Rmax−Rmin).

A row select line 45 is arranged corresponding to a row of the MTJ memory cells. Row select line 45 is a collective representation of word lines WL's for data reading and write digit lines WDL's for data writing. Further, a bit line is arranged corresponding to a column of MTJ memory cells. Every two adjacent bit lines form a bit line pair BLP. In the following two bit lines forming one bit line pair BLP will be also denoted as bit lines BL and/BL, respectively.

In each row of memory cells, regular memory cell 20 is connected to every other bit line including bit line BL and bit line /BL. For example, regular memory cells 20's in an even-numbered row are connected to bit line /BL and regular memory cells 20's in an odd-numbered row are connected to bit line BL.

As a result, regular memory cells 20's are arranged alternately at intersections of row select lines 45's and bit lines BL's, /BL's. Each regular memory cell 20 is connected between a corresponding bit line BL or /BL and a source line SL. Source line SL transmits a voltage of a fixed level (for example a ground voltage GND).

Row select unit 30 receives control signals RDE and WTE and performs row selection according to a supplied row address signal. In the following, a row address indicated by address bits RAdd (0)–RAdd (m) of (m+1) bits, where "m" is a natural number, is also indicated as a row address signal RAdd (0:m). In a data reading cycle, control signal RDE is set to an active state, and in a data writing cycle, control signal WTE is set to an active state.

Row select unit 30 has a driver function for each write digit line WDL and drives one end side of each write digit line WDL at the time of data writing with a voltage according to the result of row selection based on row address signal RAdd (0:m). Further, row select unit 30 has a driver function for each word line WL and drives the voltage of each word line WL at the time of data reading according to the result of row selection based on row address signal RAdd (0:m). WDL current control unit 60 connects the other end side of each write digit line WDL to ground voltage GND regardless of the result of address selection.

Specifically, at the time of data reading, a word line WL in a selected row is driven by power supply voltage Vcc and set to a logical high level (hereinafter simply referred to as an H level). During the operation other than data reading, word line WL is turned to a non-select state, driven by ground voltage GND and set to a logical low level (hereinafter simply referred to as an L level). Similarly, at the time of data writing, a write digit line WDL in a selected row is set to a select state (H level) and driven by power supply voltage Vcc whereas during the operation other than data writing, write digit line WDL is set to a non-select state (L level) and driven by ground voltage GND.

As a result, at the time of data writing, a data write current to the write digit line WDL in the selected row is supplied in a direction from row select unit 30 to WDL current control unit 60. Data write current is not supplied to a write digit line WDL in a non-selected row. At the time of data reading, a word line WL corresponding to a selected row is set to a select state (H level), whereas a word line WL in a non-selected row is maintained at a non-select state (L level).

At the time of data writing, BL current control circuits 70*a* and 70*b* drive a voltage at either ends of bit lines BL's, /BL's according to a control signal WDE, the result of a column selection shown by column select unit 40, and write data WDAT. Specifically, both ends of bit line BL (or /BL) in a non-selected column are driven by ground voltage GND, whereas one end side and another end side of bit line BL (or /BL) in a selected column are driven by power supply voltage Vcc and ground voltage GND, respectively. Thus a data writing current is supplied in a direction from BL current control circuit 70*a* to BL current control circuit 70*b* or in a direction from BL current control circuit 70*b* to BL current control circuit 70*a* according to the level of write data WDAT. When data writing is not performed, each of BL current control circuits 70*a* and 70*b* does not drive either ends of bit lines BL, /BL to power supply voltage Vcc and ground voltage GND.

At the time of data writing, as data writing current is supplied to either of a corresponding write digit line WDL and a corresponding bit line BL (or /BL) in a selected memory cell, tunneling magneto-resistance element 22 is magnetized in a direction corresponding to the data writing current of the corresponding bit line BL (or /BL), thus data writing is performed.

At the time of data reading, BL selector 80 connects bit lines BL and /BL constituting a bit line pair BLP of a selected column with data reading amplifier 90 based on control signal RDE and the result of column selection shown by column select unit 40. Data reading amplifier 90 generates read data RDAT from the selected memory cell based on a passing current of bit line BL and /BL constituting a bit line pair BLP of the selected column.

In MRAM device 1, data reading is performed with a selected bit line pair BLP, BL selector 80 and data reading amplifier 90 shown in block 100.

In addition, programming circuit 41 includes a programming element (not shown) fixedly storing information in response to an external input (programming input) outside from programming circuit 41 as will be described in detail below and supplies a programming signal PRG as an output corresponding to an application of an external input to the programming element. A representative of the programming element includes a fuse element which can be blown by an external application of a laser light.

(Data Reading with General Configuration of Reference Cell Row)

Next, an arrangement of reference cells will be described. Known arrangements of reference cells include an arrangement of reference cell columns as disclosed in the above-described publication and an arrangement where rows of reference cells are arranged such that the reference cell and the regular memory cell share bit lines BL, /BL. In the following, the configuration of reference cell row will be described.

Figure 2:
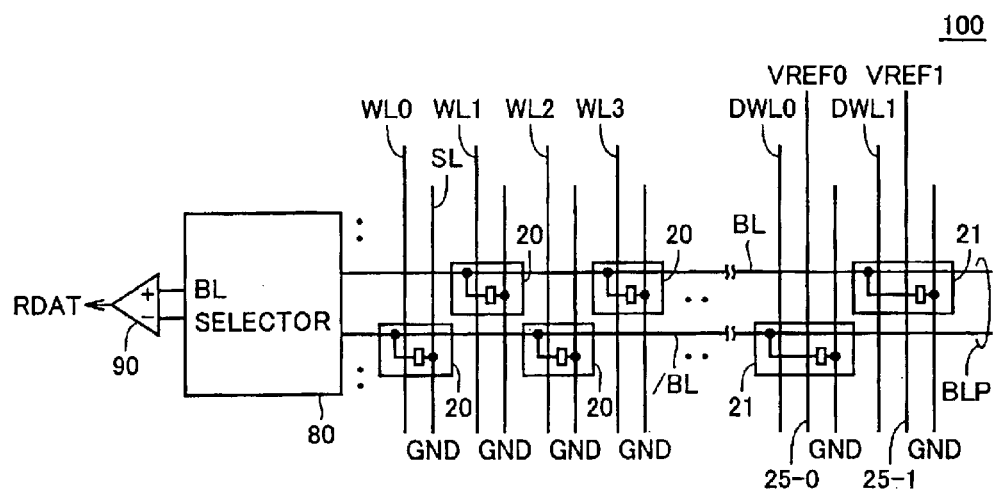
FIG. 2 is a circuit diagram illustrative of data reading performed in a device with a general configuration of reference cell rows.

FIG. 2 is a circuit diagram illustrative of a memory cell array configuration and a data reading operation in a general arrangement of reference cell rows. In FIG. 2, a detailed configuration of block 100 shown in FIG. 1, in other words, a configuration corresponding to each bit line pair BLP for data reading is shown.

With reference to FIG. 2, as described above in connection with FIG. 1, regular memory cells 20's corresponding to word lines WL1, WL3, . . . in the odd-numbered rows are connected to bit line BL, whereas regular memory cells 20's corresponding to word lines WL0, WL2, . . . in the even-numbered rows are connected to bit line /BL.

Figure 3:
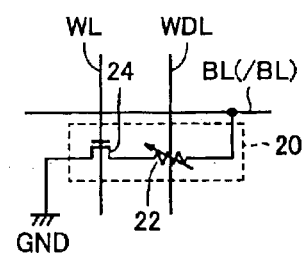
FIG. 3 is a circuit diagram showing a configuration of each regular memory cell.

With reference to FIG. 3, regular memory cell 20 includes tunneling magneto-resistance element 22 and an access transistor 24 connected in series between the corresponding bit line BL (or /BL) and ground voltage GND.

A representative example of access transistor 24 provided as an access switch is constituted from an N-MOS transistor having a gate connected to a corresponding word line WL. At the time of data reading, the corresponding word line WL is set to a select state (H level), and an access transistor 24 is turned on in response thereto, whereby a memory cell current Imin or Imax corresponding to the resistance (Rmax or Rmin) of the tunneling magneto-resistance element 22 is generated in a path from bit line BL (or /BL) to ground voltage GND.

At the time of data writing, while access transistor 24 is in a turned-off state in response to the non-select state (L level) of word line WL, a data writing current is supplied to the corresponding write digit line WDL and the corresponding bit line BL (or /BL), whereby the data writing is implemented.

With reference to FIG. 2 again, a reference cell 21 is further connected to bit lines BL and /BL.

Reference cells 21's are arranged such that they form two reference cell rows, and a combination of dummy word line DWL0 and reference voltage line 25-0 and a combination of dummy word line DWL1 and reference voltage line 25-1 are arranged for two reference cell rows, respectively. A reference cell 21 corresponding to dummy word line DWL0 is connected to one bit line /BL whereas a reference cell 21 corresponding to dummy word line DWL1 is connected to another bit line BL. Reference cell 21 is arranged in a similar manner corresponding to each bit line pair BLP. Hence, reference cells 21's are arranged alternately at intersections of dummy word lines DWL0, DWL1 and bit lines BL, /BL.

Figure 4:
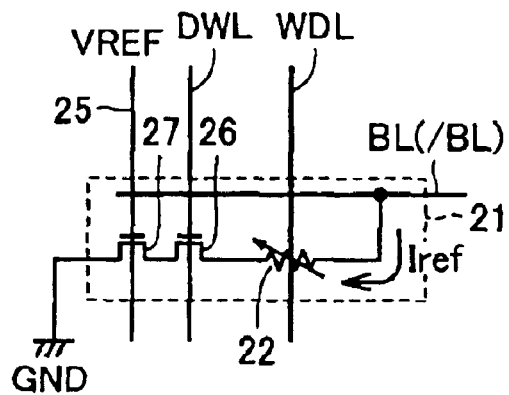
FIG. 4 is a circuit diagram showing a configuration of each reference cell.

FIG. 4 is a circuit diagram showing a configuration of each reference cell 21.

With reference to FIG. 4, reference cell 21 includes tunneling magneto-resistance element 22 and access transistors 26 and 27 connected in series between the corresponding bit line BL (or /BL) and ground voltage GND. Data corresponding to resistance Rmin is previously written into tunneling magneto-resistance element 22 in reference cell 21.

In reference cell 21, an access switch is formed with access transistors 26 and 27. The gate of access transistor 26 is connected to a corresponding dummy word line DWL (collective representation of dummy word lines DWL0 and DWL1), whereas the gate of access transistor 27 is connected to reference voltage line 25 (collective representation of reference voltage lines 25-0 and 25-1).

When selected, dummy word lines DWL0 and DWL1 are driven to power supply voltage Vcc (H level) in the same manner as for word line WL. Hence, the on-resistance of access transistor 26 is equivalent to that of access transistor 24 in regular memory cell 20. Reference voltage VREF transmitted by reference voltage lines 25-0 and 25-1 is set such that the current passing through reference cell 21, in other words, reference current Iref is at the intermediate level of memory cell currents Imin and Imax. Thus, the resistance of access transistor 27 having a gate receiving reference voltage VREF is higher than the on-resistance of access transistors 24 and 26, and the sum of resistances of access transistor 27 and tunneling magneto-resistance element 22 in reference cell 21 is set to the intermediate level of the sum of the on-resistance of access transistor 24 and resistances Rmax and Rmin of tunneling magneto-resistance element 22 in regular memory cell, respectively.

Figure 5:
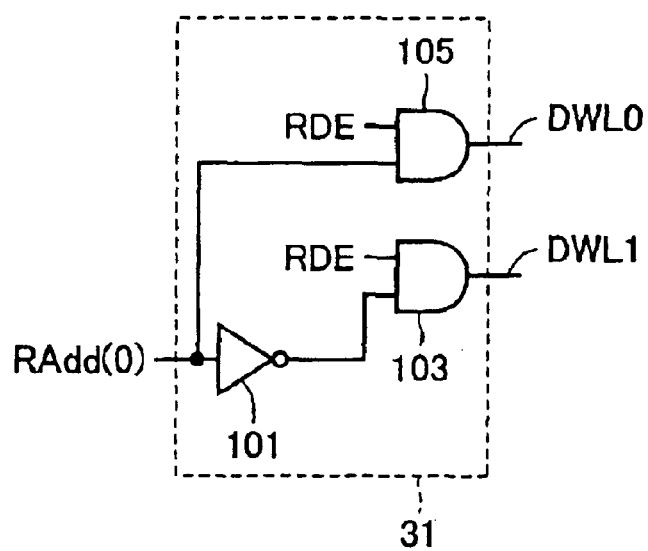
FIG. 5 is a circuit diagram showing a configuration of a dummy word line control unit in a row select unit shown in FIG. 1.

FIG. 5 is a circuit diagram showing a configuration of a control portion of dummy word lines DWL0 and DWL1 in row select unit 30 shown in FIG. 1.

With reference to FIG. 5, dummy word line control unit 31 provided in row select unit 30 includes an inverter 101 and logic gates 103 and 105. Inverter 101 inverts the lowest bit RAdd (0) of the row address and supplies the inverted bit as an output. Thus, address bit RAdd (0) is set to "0" (L level) when an even-numbered row is selected and to "1" (H level) when an odd-numbered row is selected.

Logic gate 103 drives a voltage on dummy word line DWL1 according to the result of an AND operation of the output of inverter 101 and control signal RDE. Similarly, logic gate 105 drives a voltage on dummy word line DWL0 according to the result of an AND operation of address bit RAdd (0) and control signal RDE.

As a result, when an even-numbered row, in other words, one of word lines WL0, WL2, . . . is selected at the time of data reading, dummy word line DWL1 is set to a select state (H level) and dummy word line DWL0 is set to a non-select state (L level). Thus, for each bit line pair BLP, bit line /BL is connected to regular memory cell 20 whereas bit line BL is connected to reference cell 21.

On the contrary, when an odd-numbered row, in other words, one of word lines WL1, WL3, . . . is selected at the time of data reading, dummy word line DWL1 is set to a non-select state (L level) and dummy word line DWL0 is set to a select state (H level). Thus, for each bit line pair BLP, bit line BL is connected to regular memory cell 20 and bit line /BL is connected to reference cell 21.

With reference to FIG. 2 again, at the time of data reading, on one of bit lines BL, /BL constituting a bit line pair BLP, a memory cell current Imax or Imin is generated by a selected memory cell. On another of bit lines BL, /BL, reference current Iref is generated by reference cell 21. BL selector 80 connects a bit line pair BLP corresponding to the selected memory cell with data reading amplifier 90. Thus, the data reading amplifier 90 can generate read data RDAT based on a passing current of the bit lines BL and /BL corresponding to the selected column.

Next, an arrangement of reference cells and an arrangement of spare cells to be replaced with the reference cells according to the first embodiment will be described in detail.

(Arrangements of Reference Cells and Spare Cells According to the First Embodiment)

Figure 6:
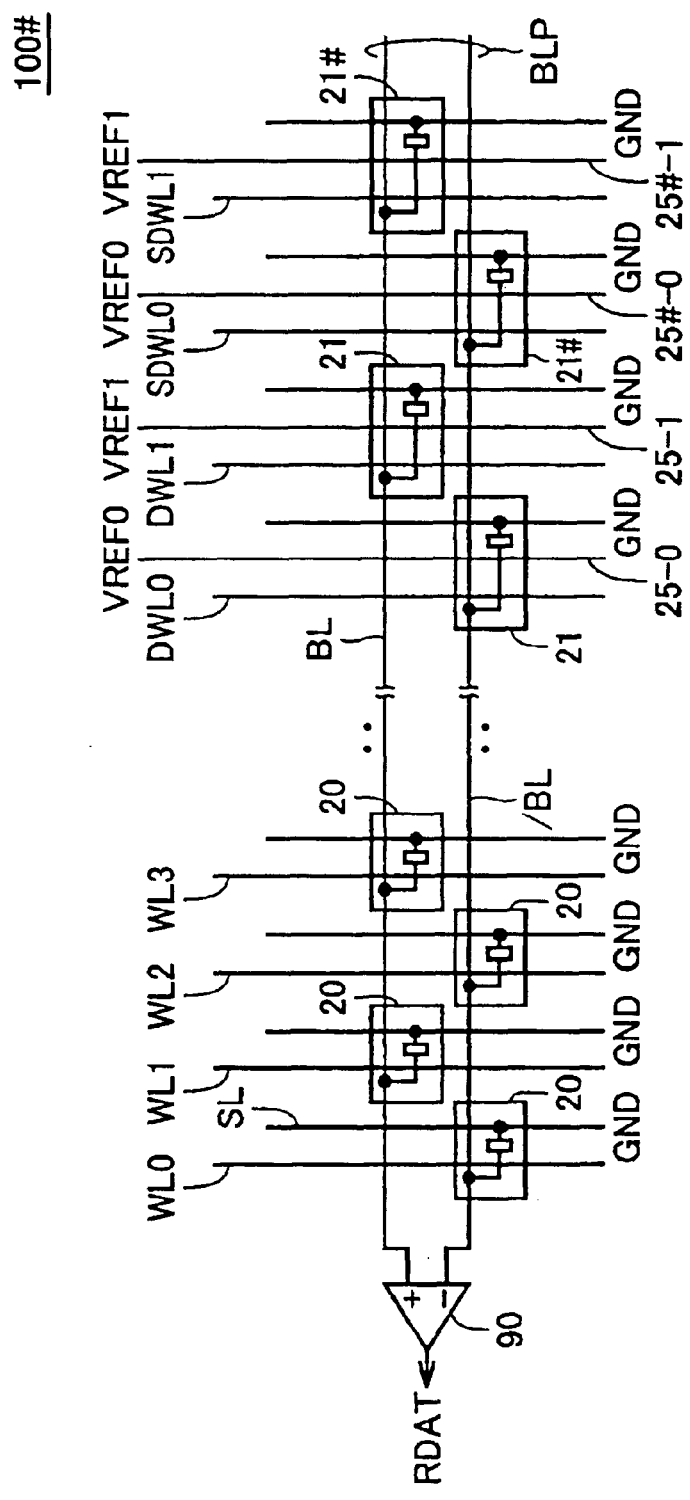
FIG. 6 is a diagram illustrative of an arrangement of reference cells and spare cells according to a first embodiment.

FIG. 6 is a diagram illustrative of the arrangement of reference cells and spare cells according to the first embodiment. In FIG. 6 as in FIG. 2, the configuration of block 100# corresponding to one bit line pair BLP is shown. In the MRAM device according to the first embodiment, the configuration of the memory cell array corresponding to each bit line pair BLP is changed from that of the MRAM device shown in FIG. 1 as block 100 is replaced with block 100#. In the following, the MRAM device according to the first embodiment will be described only with regard to the difference from the general configuration of reference cell rows described in connection with FIGS. 2 to 5. In other points, the description heretofore suffices and the description thereof will not be repeated.

With reference to FIG. 6, the configuration according to the first embodiment is different from that shown in FIG. 2 in that spare cells (spare reference cells) 21#'s are further arranged to be replaced with reference cells 21's and at least two spare cell rows are formed. Corresponding to two spare cell rows, a combination of spare word lines SDWL0 and reference voltage line 25#-0 and a combination of spare word line SDWL1 and reference voltage line 25#-1 are arranged, respectively. Spare cell 21# corresponding to spare word line SDWL0 is connected to bit line /BL in a similar manner to reference cell 21 corresponding to dummy word line DWL0. On the other hand, spare cell 21# corresponding to spare word line SDWL1 is connected to bit line BL in a similar manner to reference cell 21 corresponding to dummy word line DWL1. In other words, spare cells 21#'s are arranged alternately at intersections of spare word lines SDWL0, SDWL1 and bit lines BL, /BL.

The configuration of spare cell 21# is similar to that of reference cell 21. Each spare cell 21#, similarly to the configuration shown in FIG. 4, includes tunneling magneto-resistance element 22 to which data corresponding to resistance Rmin is previously written in and access transistors 26 and 27 constituting an access switch. In spare cell 21#, the gate of access transistor 26 is connected to a corresponding spare word line SDWL (collective representation of SDWL0 and SDWL1) and the gate of access transistor 27 is connected to reference voltage line 25# (collective representation of 25#-0 and 25#-1).

Figures 7, 8:
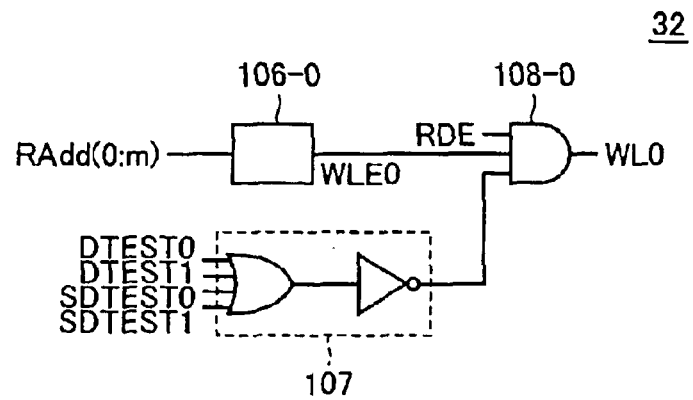
FIG. 7 is a circuit diagram showing a configuration of a word line control unit according to the first embodiment.
FIG. 8 is a diagram illustrative of a setting of test control signals.

FIG. 7 is a circuit diagram showing a configuration according to the first embodiment of a control section of a word line WL in row select unit 30. Though a configuration corresponding to a word line WL0 alone is shown as a representative in FIG. 7, the similar configuration is provided corresponding to each word line WL.

Word line control unit 32 includes a decode unit 106-0 and logic circuits 107 and 108-0. Decode unit 106-0 generates a decode signal WLE0 set to an H level when word line WL0 is selected and to an L level when word line WL0 is not selected according to row address signal RAdd (0:m). Logic circuit 107 generates test control signals DTEST0, DTEST1 and the result of an NOR operation of SDTEST0 and SDTEST1.

FIG. 8 is a diagram illustrative of a setting of test control signals.

With reference to FIG. 8, an operation test in the MRAM device according to the first embodiment of the present invention includes four test patterns i)-iv). In each of test patterns i)-iv), one of test control signals DTEST0, DTEST1, SDTEST0 and SDTEST1 is set to an H level and the rest are set to an L level.

Test patterns i) and ii) where test control signal DTEST0 and DTEST1 are set to an H level, respectively, are for a reference cell test mode in which the defect of reference cell 21 is detected. In these test patterns, reference cell 21 is tested if it generates a suitable reference current Iref through the check of the access of reference cells 21's corresponding to dummy word lines DWL0 and DWL1.

Similarly, test patterns iii) and iv) are for a spare reference cell test mode in which the defect of spare cell 21# is detected. In these test patterns, it is tested whether spare cell 21# generates a suitable reference current Iref, in other words, whether spare cell 21# can be a spare of reference cell 21, through the check of the access of spare cells 21#'s corresponding to spare word lines SDWL0 and SDWL1, respectively.

With reference to FIG. 7 again, logic gate 108-0 drives a voltage of a corresponding word line WL0 according to the result of an AND operation of control signal RDE, decode signal WLE0 from decode unit 106-0 and an output signal from logic circuit 107.

At the time of normal data reading where all test control signals are set to an L level, each word line WL is activated to a select state (H level) when it corresponds with a selected row and is deactivated to a non-select state (L level) when it does not correspond with a selected row.

On the other hand, when one of test control signals DTEST0, DTEST1, SDTEST0 and SDTEST1 is set to an H level at the time of testing, each word line WL corresponding to a regular memory cell is forcefully deactivated.

Figure 9:
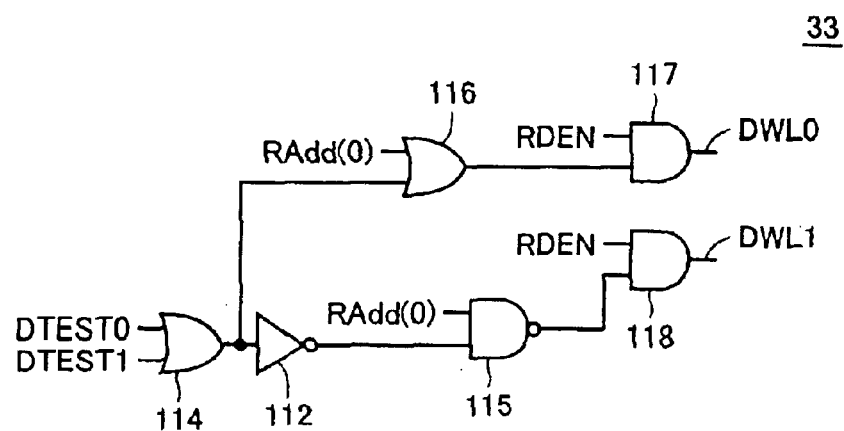
FIG. 9 is a circuit diagram showing a configuration of a dummy word line control unit according to the first embodiment.

FIG. 9 is a circuit diagram showing a configuration of dummy word line control unit 33 according to the first embodiment. Dummy word line control unit 33 is arranged in place of dummy word line control unit 31 shown in FIG. 5 in row select unit 30 of FIG. 1.

With reference to FIG. 9, dummy word line control unit 33 includes an inverter 112, and logic gates 114-118.

Logic gate 114 supplies as an output the result of an OR operation of test control signals DTEST0 and DTEST1. Inverter 112 inverts the output of logic gate 114 and supplies the inverted signal as an output. Logic gate 116 supplies as an output the result of an OR operation of the output from logic gate 114 and address bit RAdd (0). Logic gate 115 supplies as an output the result of an NAND operation of the output of inverter 112 and address bit RAdd (0). Logic gate 117 drives a voltage of dummy word line DWL0 according to the result of an AND operation of control signal RDEN and the output of logic gate 116. Logic gate 118 drives a voltage of dummy word line DWL1 according to the result of an AND operation of control signal RDEN and the output of logic gate 115.

Hence, when control signal RDEN is set to an L level, each of dummy word lines DWL0 and DWL1 is set to a non-select state (L level). On the other hand when control signal RDEN is set to an H level, dummy word lines DWL0 and DWL1 are set to either a select state (H level) or a non-select state (L level) according to the output level of logic gates 116 and 115, respectively.

The outputs of logic gates 115 and 116 attain an H level and an L level or an L level and an H level, respectively, according to address bit RAdd (0) when test control signals DTEST0 and DTEST1 are both set to an L level. On the other hand, when test control signal DTEST0 or DTEST1 is set to an H level, the outputs of logic gates 115 and 116 attain an H level regardless of address bit RAdd (0).

Figure 10:
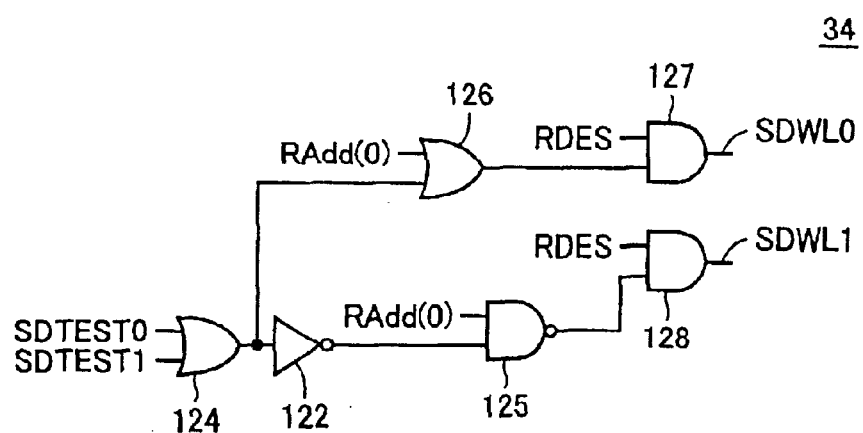
FIG. 10 is a circuit diagram showing a configuration of a spare word line control unit according to the first embodiment.

FIG. 10 is a circuit diagram showing a configuration of spare word line control unit 34 according to the first embodiment. Spare word line control unit 34 is provided in row select unit 30 of FIG. 1.

With reference to FIG. 10, spare word line control unit 34 includes an inverter 122 and logic gates 124-128.

Logic gate 124 supplies as an output the result of an OR operation of test control signals SDTEST0 and SDTEST1. Inverter 122 further inverts the output of logic gate 124 and supplies the result as an output. Logic gate 126 supplies as an output the result of an OR operation of the output of logic gate 124 and address bit RAdd (0). Logic gate 125 supplies as an output the result of an NAND operation of the output of inverter 122 and address bit RAdd (0). Logic gate 127 drives a voltage on spare word line SDWL0 according to the result of an AND operation of control signal RDES and the output of logic gate 126. Logic gate 128 drives a voltage on spare word line SDWL1 according to the result of an AND operation of control signal RDES and the output of logic gate 125.

Hence, when control signal RDES is set to an L level, each of spare word lines SDWL0, SDLW1 is set to a non-select state (L level). On the other hand, when control signal RDES is set to an H level, spare word lines SDWL0 and SDWL1 are set to a select state or a non-select state according to the output level of logic gates 126 and 125, respectively.

The outputs of logic gates 125, 126 attain an H level and an L level or an L level and an H level, respectively, according to address bit RAdd (0) when test control signals SDTEST0 and SDTEST1 are set to an L level. On the other hand, when test control signal SDTEST0 or SDTEST1 is set to an H level, the outputs of logic gates 125, 126 attain an H level regardless of address bit RAdd (0).

Next, the generation of control signals RDEN and RDES to be used in dummy word line control unit 33 and spare word line control unit 34 will be described.

Figure 11:
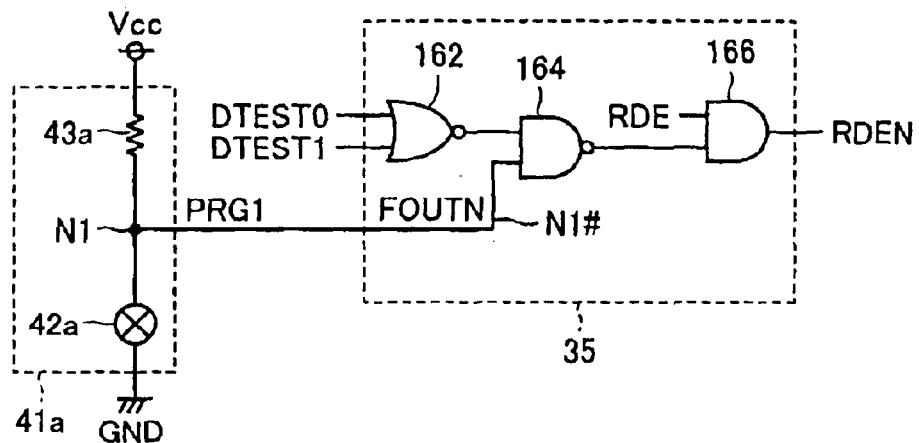
FIG. 11 is a circuit diagram showing a configuration where a control signal is generated to be used in the dummy word line control unit.

FIG. 11 is a circuit diagram showing a configuration for the generation of control signal RDEN.

With reference to FIG. 11, programming unit 41a in programming circuit 41 includes a fuse element (programming element) 42a connected between ground voltage GND and a node N1 generating programming signal PRG1 and a high resistance element 43a connected between power supply voltage Vcc and node N1.

Before fuse element 42a is blown, the voltage on node N1, in other words programming signal PRG1 is set to an L level (ground voltage GND) according to the resistance ratio of fuse element 42a and high resistance element 43a. On the other hand, after fuse element 42a is blown, programming signal PRG1 is set to an H level.

Replacement control unit 35 in row select unit 30 has logic gates 162, 164 and 166. Logic gate 162 supplies as an output the result of an NOR operation of test control signals DTEST0 and DTEST1. Logic gate 164 supplies as an output the result of an NAND operation of signal FOUTN and the output of logic gate 162. Programming signal PRG1 as signal FOUTN is directly supplied to logic gate 164 as an input. Logic gate 166 supplies control signal RDEN as an output, which is the result of an AND operation of the output of logic gate 164 and control signal RDE.

Figure 12:
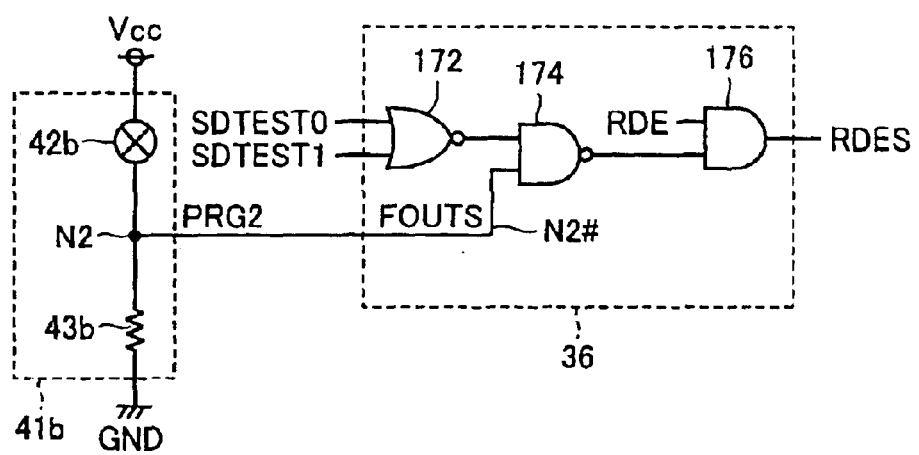
FIG. 12 is a circuit diagram showing a configuration where a control signal is generated to be used in a spare word line control unit.

FIG. 12 is a circuit diagram showing the configuration for the generation of control signal RDES.

With reference to FIG. 12, programming unit 41b in programming circuit 41 includes a fuse element (programming element) 42b connected between a node N2 generating programming signal PRG2 and power supply voltage Vcc and a high resistance element 43b connected between ground voltage GND and node N2.

Before fuse element 42b is blown, the voltage on node N2, in other words, programming signal PRG2 is set to an H level (power supply voltage Vcc). On the other hand, after fuse element 42b is blown, programming signal PRG2 is set to an L level.

Replacement control unit 36 in row select unit 30 has logic gates 172, 174 and 176. Logic gate 172 supplies as an output the result of an NOR logic operation of test control signals SDTEST0 and SDTEST1. Logic gate 174 supplies as an output the result of an NAND operation of signal FOUTS and the output of logic gate 172. Programming signal PRG2 as a signal FOUTS is directly supplied to logic gate 174 as an input. Logic gate 176 supplies control signal RDES as an output, which is the result of an AND operation of the output of logic gate 174 and control signal RDE.

When reference cells are not defective and there is no need of replacement of reference cells with spare cells, fuse elements 42a and 42b are not blown. In this case, programming signal PRG1 (signal FOUTN) is set to an L level and programming signal PRG2 (signal FOUTS) is set to an H level.

On the other hand, if reference cells have a defect and there is need of replacement of reference cells with spare cells, fuse elements 42a and 42b are blown. In this case, programming signal PRG1 (signal FOUTN) is set to an H level, and programming signal PRG2 (signal FOUTS) is set to an L level.

At the time of normal data reading when test control signals DTEST0, DTEST1, SDTEST0 and SDTEST1 are set to an L level, the outputs of logic gates 162 and 172 are at an H level. Hence, when fuse elements 42a and 42b are not blown, control signal RDEN is set to the same level as control signal RDE and control signal RDES is fixed to an L level. On the other hand, when fuse elements 42a and 42b are blown, control signal RDES is set to the same level as control signal RDE and control signal RDEN is fixed to an L level.

Next, the setting of control signals RDEN and RDES in a test mode will be described. In the test mode in which the reference cell and the spare cell are tested, fuse elements 42a and 42b have not been blown.

In the reference cell test mode shown in FIG. 8, test control signal DTEST0 or DTEST1 is set to an H level and test control signals SDTEST0 and SDTEST1 are set to an L level. Hence, control signals RDES and RDEN are set in the same manner as in the normal data reading where fuse elements 42a and 42b have not been blown, in other words, control signal RDEN is set to the same level as control signal RDE and control signal RDES is fixed to an L level.

On the other hand, in the spare reference cell test mode shown in FIG. 8, test control signal SDTEST0 or SDTEST1 is set to an H level and each of test control signals DTEST0 and DTEST1 is set to an L level. Hence, control signals RDES and RDEN are set in the same manner as in the normal data reading where fuse elements 42a and 42b are blown, in other words, control signal RDES is set to the same level as control signal RDE and control signal RDEN is fixed to an L level.

With reference to FIGS. 9 and 10 again, when reference cells are not defective and fuse elements 42a and 42b have not been blown, control signal RDES is fixed to an L level and control signal RDEN is set to the same level as control signal RDE. Thus, spare word lines SDWL0 and SDWL1 are each fixed to a non-select state, whereas one of dummy word lines DWL0 and DWL1 is selected according to address bit RAdd (0). As a result, through the access to reference cell 21 and the selected memory cell in regular memory cell 20, data reading is performed.

Because of the existence of a defective reference cell, after fuse elements 42a and 42b are blown, control signal RDEN is set to an L level and control signal RDES is set to the same level as control signal RDE. Thus, each of dummy word lines DWL0 and DWL1 is fixed to a non-select state, whereas one of spare word lines SDWL0 and SDWL1 is selected according to address bit RAdd (0) instead of dummy word lines DWL0 and DWL1. As a result, when at least one reference cell 21 is defective, a plurality of reference cells 21's are replaced with a plurality of spare cells 21#'s and data reading is performed.

On the other hand, in the reference cell test mode, each of dummy word lines DWL0 and DWL1 is set to a select state (H level) whereas each of spare word lines SDWL0 and SDWL1 is set to a non-select state (L level).

In the spare reference cell test mode, each of spare word line SDWL0 and SDWL1 is set to a select state (H level) whereas each of dummy word lines DWL0 and DWL1 is set to a non-select state (L level).

Next, a voltage control of the reference voltage line in the reference cell and the spare cell will be described.

Figure 13:
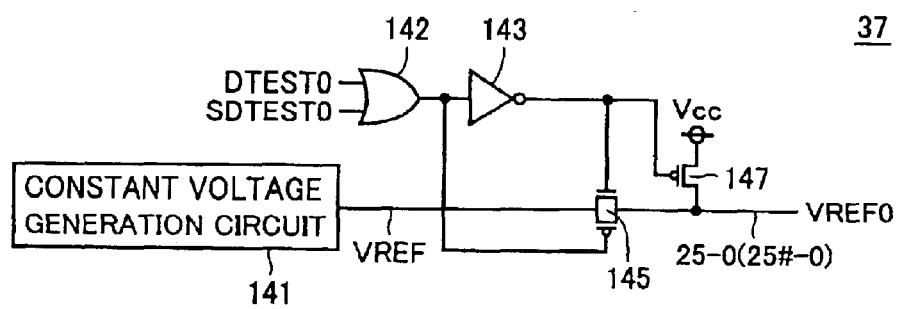
FIG. 13 is a circuit diagram illustrative of a configuration of a first voltage control circuit which controls a voltage of a reference voltage line.

FIG. 13 is a circuit diagram illustrative of the configuration of voltage control circuit 37 controlling the voltage of reference voltage lines 25-0 and 25#-0.

With reference to FIG. 13, voltage control circuit 37 includes a constant voltage generation circuit 141 generating a reference voltage VREF, a logic gate 142, an inverter 143, a transfer gate 145 and a drive transistor 147.

Logic gate 142 supplies as an output the result of an OR operation of test control signals DTEST0 and SDTEST0. Inverter 143 inverts the output of logic gate 142 and supplies the result as an output. Transfer gate 145 is turned on when the output of logic gate 142 is at an L level and is turned off when the output of logic gate 142 is at an H level, in response to the outputs of logic gate 142 and inverter 143. Drive transistor 147 is formed from a P-MOS transistor connected between power supply voltage Vcc and reference voltage lines 25-0 and 25#-0, and having the gate receiving the output of inverter 143.

Thus, in the test patterns i) and iii) in which the output of logic gate 142 is set to an H level, supply voltage VREF0 to reference voltage lines 25-0 and 25#-0 is set to the level of power supply voltage Vcc, the same level as the voltage on word line WL in a select state. On the other hand, in the normal data reading and in test patterns ii) and iv), in other words, when the output of logic gate 142 is set to an L level, voltage VREF0 is set to the level of reference voltage VREF.

Figure 14:
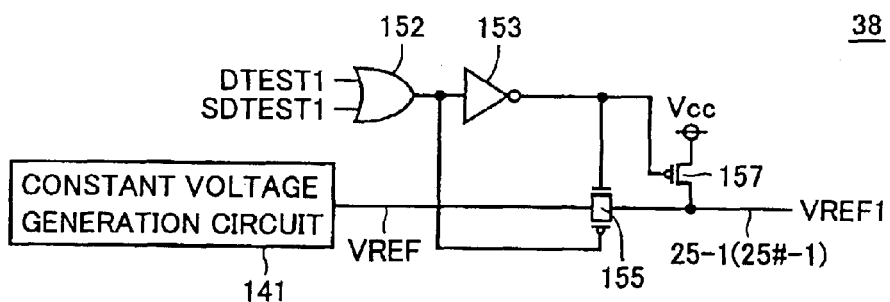
FIG. 14 is a circuit diagram illustrative of a configuration of a second voltage control circuit which controls a voltage of a reference voltage line.

FIG. 14 is a circuit diagram illustrative of the configuration of voltage control circuit 38 controlling the voltage of reference voltage lines 25-1 and 25#-1.

With reference to FIG. 14, voltage control circuit 38 includes a constant voltage generation circuit 141 generating reference voltage VREF, a logic gate 152, an inverter 153, a transfer gate 155 and drive transistor 157. Here, constant voltage generation circuit 141 may be shared by voltage control circuits 37 and 38 or may be provided separately for each circuit.

Logic gate 152 supplies as an output the result of an OR operation of test control signals DTEST1 and SDTEST1. Inverter 153 inverts the output of logic gate 152 and supplies the result as an output. Transfer gate 155 is turned on when the output of logic gate 152 is at an L level and is turned off when the output of logic gate 152 is at an H level, in response to the outputs of logic gate 152 and inverter 153. Drive transistor 157 is formed from a P-MOS transistor connected between power supply voltage Vcc and reference voltage lines 25-1 and 25#-1, and having the gate receiving the output of inverter 153.

Thus, in the test patterns ii) and iv) in which the output of logic gate 152 is set to an H level, supply voltage VREF1 to reference voltage lines 25-1 and 25#-1 is set to the level of power supply voltage Vcc, the same level as the voltage on word line WL in a select state. On the other hand, in the normal data reading and in test patterns i) and iii), in other words, when the output of logic gate 152 is set to an L level, voltage VREF1 is set to the level of reference voltage VREF.

Figure 15:
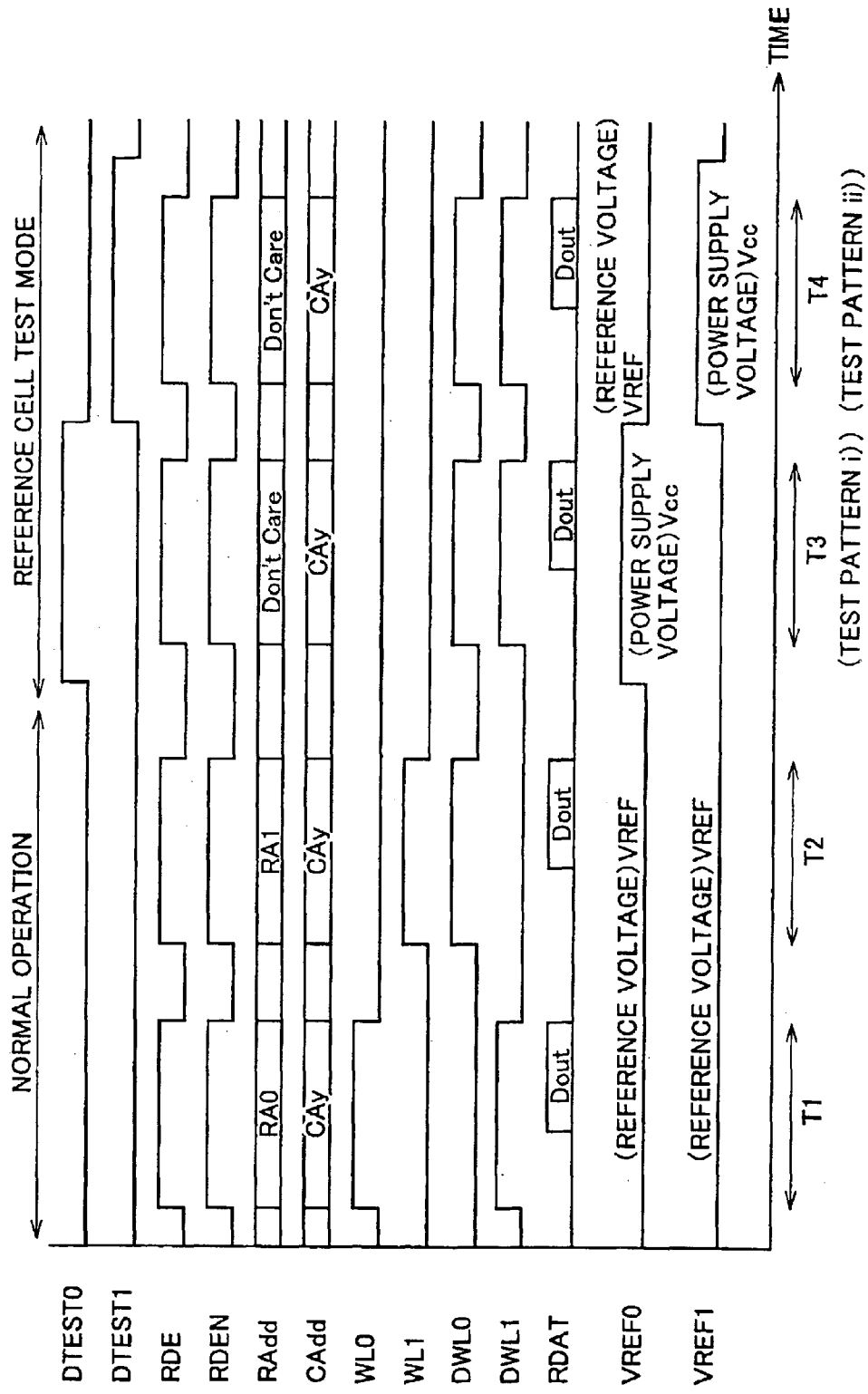
FIG. 15 is an operation waveform chart illustrative of operations in normal data reading and in a reference cell test mode of an MRM device according to the first embodiment.

FIG. 15 is an operation waveform chart illustrative of the operations in the normal data reading (normal operation) and the reference cell test mode in the MRAM device according to the first embodiment.

In time periods T1 and T2, an operation waveform for the normal operation is shown. Here, it is assumed that each reference cell is not defective and fuse elements 42a and 42b have not been blown. Hence, in the normal operation, each of spare word lines SDWL0 and SDWL1 is fixed to a non-select state (L level) (not shown).

In the normal data reading, according to the length of the period when control signal RDE determining a data reading cycle is in an active state (H level), control signal RDEN is set to an active state (H level). On the other hand, as fuse elements 42a and 42b have not been blown, control signal RDES is fixed to an L level.

During time period T1, row address RA0 for selecting word line WL0 and column address CAy for selecting a $y^{th}$ (y is a natural number) bit line pair are supplied as inputs. According to these inputs, word line WL0 is selected and set to an H level (power supply voltage Vcc), to connect the selected memory cell to the corresponding bit line /BLy (not shown). To bit line /BLy, memory cell current Imax or Imin corresponding to the stored data in the selected memory cell is applied.

As an even-numbered word line WL0 is selected, dummy word line DWL1 is set to a select state (H level) and dummy word line DWL0 is set to a non-select state (L level) accordingly. Further, each of voltage VREF0 and VREF1 applied to the gate of access transistor 27 in reference cell 21 is set to the level of reference voltage VREF. Thus, in response to the selection of dummy word line DWL1, reference current Iref is applied to bit line BLy (not shown) which forms a pair with bit line /BLy.

As a result, based on a passing current of paired bit lines BLy and /BLy, stored data out of the selected memory cell is supplied as an output from data reading amplifier 90, as read data RDAT.

During time period T2, row address RA1 and column address CAy for selecting word line WL1 are supplied as inputs. In response to these inputs, word line WL1 instead of word line WL1 is selected. In other words, in time period T2, word line WL1 and dummy word line DWL0 are selected and dummy word line DWL1 is not selected.

Accordingly, memory cell current Imax or Imin according to stored data in the selected memory cell is applied to bit line BLy. On the other hand, bit line /BLy is connected to reference cell 21 and reference current Iref is applied thereto. Thus, in the same manner as in time period T1, data reading from the selected memory cell is performed.

In time periods T3 and T4, the operation in the reference cell test mode is performed.

In time period T3, test control signal DTEST0 is set to an H level according to test pattern i) shown in FIG. 8. Signal DTEST1 is set to an L level.

As each word line WL corresponding to the regular memory cell is fixed to a non-select state (L level) in the test mode, row address signal RAdd is not particularly necessary. Dummy word lines DWL0 and DWL1 are each selected and bit lines BL and /BL forming a bit line pair BLP are each connected to reference cell 21.

In test pattern i), voltage VREF0 of reference voltage line 25-0 is set to the level of power supply voltage Vcc in the same manner as at the time when word line WL is in a select state. On the other hand, voltage VREF1 of reference voltage line 25-1 is set to the level of reference voltage VREF in the same manner as at the time when dummy word line DWL is in a select state in the normal data reading.

As a result, the passing current of reference cell 21 corresponding to dummy word line DWL1 attains the level of reference current Iref, whereas passing current of reference cell 21 corresponding to dummy word line DWL0 attains the level of current Imax as for the regular memory cell.

In this status, according to column address CAy supplied as an input, bit lines BLy, /BLy in the yth column are connected to data reading amplifier 90. Based on the difference of passing current in bit lines BLy, /BLy, data reading amplifier 90 generates read data RDAT.

At this point, it is determined whether data corresponding to resistance Rmin is correctly read out or not based on read data RDAT. If read data RDAT is normal, the test result is that reference cell 21 corresponding to bit line BLy and dummy word line DWL1 is normal, in other words suitable reference current Iref is generated. When read data RDAT is not normal, the test result means that the reference cell is defective.

In time period T4, test control signal DTEST0 is set to an L level corresponding to test pattern ii) in FIG. 8. Here, signal DTEST1 not shown is set to an H level.

Also at time period T4, each word line WL is fixed to a non-select state (L level), and dummy word lines DWL0 and DWL1 are each selected and each of bit lines BL and /BL forming a bit line pair BLP is connected to reference cell 21.

In test pattern ii), voltage VREF0 of reference voltage line 25-0 is set to the level of reference voltage VREF, whereas voltage VREF1 of reference voltage line 25-1 is set to the level of power supply voltage Vcc in the same manner as when word line WL is in a select state.

As a result, the passing current of reference cell 21 corresponding to dummy word line DWL0 attains the level of reference current Iref, whereas passing current of reference cell 21 corresponding to dummy word line DWL1 attains the level of current Imax as for the regular memory cell.

In this state, data reading amplifier 90 generates read data RDAT based on the difference of passing current on bit lines BLy, /BLy, according to column address CAy supplied as an input.

Thus in time period T4, it can be determined whether reference cell 21 corresponding to dummy word line DWL0 of bit line /BLy is normal or not based on determination of whether read data RDAT is normal or not. Thereafter, it is possible to test whether each reference cell 21 is defective or not by sequentially switching column address signal CAdd.

Figure 16:
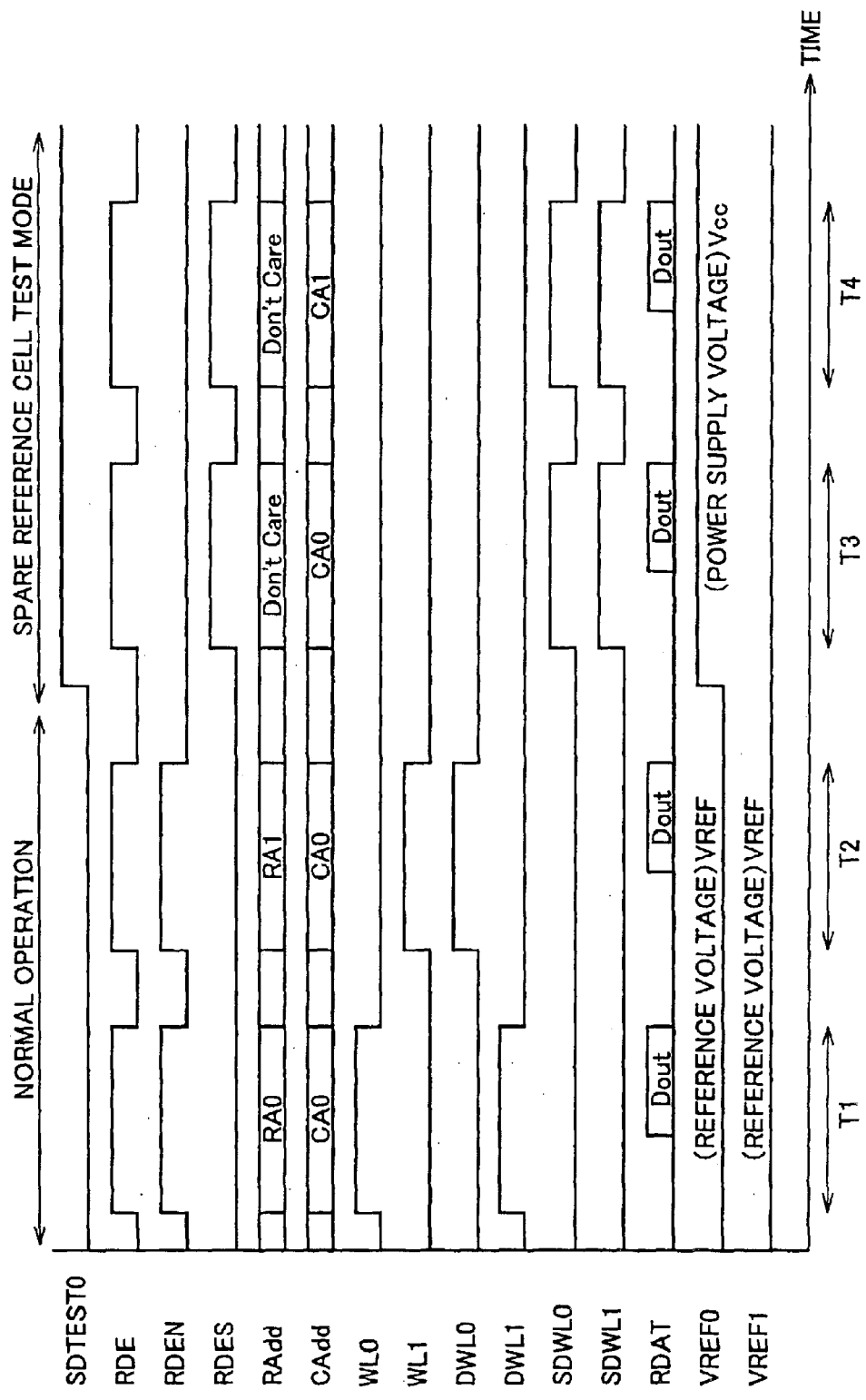
FIG. 16 is an operation waveform chart illustrative of an operation in a spare reference cell test mode of an MRAM device according to the first embodiment.

FIG. 16 is an operation waveform chart illustrative of the operation in the spare reference cell test mode of MRAM device 1.

With reference to FIG. 16, during time periods T1 and T2, an operation waveform similar to that in the normal data reading (normal operation) as shown in FIG. 15 is shown.

During time period T1, normal data reading from the selected memory cell connected to word line WL0 and bit line /BL0 is performed according to row address RA0 and column address CA0. Similarly, during time period T2, the normal data reading from the selected memory cell connected to word line WL1 and bit line /BL0 is performed according to row address RA1 and column address CA0.

The details of the operation during time periods T1 and T2 is same with those of time periods T1 and T2 shown in FIG. 15 except that a different bit line is selected, therefore the detailed description thereof will not be repeated.

On the other hand, during time periods T3 and T4, test control signal SDTEST0 is activated to an H level and test pattern iii) shown in FIG. 8 is performed. Though not shown, test control signal SDTEST1 is set to an L level.

As described above, in the spare reference cell test mode, control signal RDES is also set to an active state (H level) corresponding to the time period when control signal RDE determining the data reading cycle is in an active state (H level). On the other hand, control signal RDEN is fixed to an L level.

Also in the spare cell reference test mode, word line WL and dummy word lines DWL0 and DWL1 corresponding to the regular memory cell are fixed to a non-select state (L level). Spare word lines SDWL0 and SDWL1 are each selected and bit lines BL and /BL forming a bit line pair BLP are connected to spare cell 21#.

In test pattern iii), voltage VREF0 of reference voltage line 25#-0 is set to the level of power supply voltage Vcc in the same manner as at the time word line WL is in a select state. On the other hand, voltage VREF1 of reference voltage line 25#-1 is set to the level of reference voltage VREF in the same manner as at the time when dummy word line DWL is in a select state in the normal data reading.

As a result, the passing current of spare cell 21# corresponding to spare word line SDWL1 attains the level of reference current Iref, whereas passing current of spare cell 21# corresponding to spare word line SDWL0 attains the level of current Imax as for the regular memory cell.

In this status, according to column address CA0 supplied as an input, bit lines BL0, /BL0 are connected to data reading amplifier 90, and based on the difference of passing current in bit lines BL0, /BL0, read data RDAT is generated.

At this point, it is determined whether data corresponding to resistance Rmin is correctly read out or not based on read data RDAT. Then, the test result may be obtained that spare cell 21# corresponding to bit line BL0 and dummy word line SDWL1 is normal, in other words suitable reference current Iref is generated. On the other hand when read data RDAT is not normal, the test result will show that the spare cell is defective.

During time period T4, column address is switched from CA0 to CA1 and a spare cell test similar to that performed during the time period T3 is performed. Thus, during time period T4, the test result can be obtained about spare cell 21# corresponding to bit line BL1 and spare word line SDWL1.

Further, in the spare reference cell test mode, if test control signal SDTEST0 is set to an L level and test control signal SDTEST1 is set to an H level corresponding to test pattern iv), a voltage on reference voltage lines 25#-0 and 25#-1 can be exchanged, whereby the test of normality/defectiveness of each spare cell 21# connected to spare word line SDWL0 can be performed.

In the reference cell test mode and the spare reference cell test mode, by sequentially switching column address signal CAdd to perform the test, the formality/defectiveness of all reference cells 21's and spare cells 21#'s can be checked.

Thus, in the MRAM device according to the first embodiment, as the test mode for performing data reading based on the access of reference cells 21's or spare cells 21#'s is provided, it is possible to test whether each reference cell and each spare cell itself is defective or not.

Further, as the replacement can be performed on a row basis, in other words, a row of reference cells can be replaced with a row of spare cells, an effective replacement can be performed when a plurality of reference cells are found to be defective.

Second Embodiment

To perform the operation test of the regular memory cell, it is necessary to generate a suitable reference current using a proper reference cell. Hence, it is necessary to perform the detection of defectiveness of the reference cell and to replace the defective prior to the operation test of the regular memory cell.

In the configuration according to the first embodiment as described above with reference to FIGS. 11 and 12, it is programmed such that the dummy memory cell is replaced with the spare cell through the blowing of the fuse element (programming element).

However, according to such a procedure, it is necessary to first perform the operation test of the reference cell with a memory tester, then to move the MRAM device from the memory tester to a laser trimming apparatus to blow the fuse element, and again to mount the MRAM device onto the memory tester to perform the operation test of the regular memory cell.

Hence, in the second embodiment, a configuration will be described which allows a sequential operation test of the regular memory cell on the tester without the transport of the device to other apparatus such as laser trimming apparatus even when the defectiveness of the reference cell is found.

Figure 17:
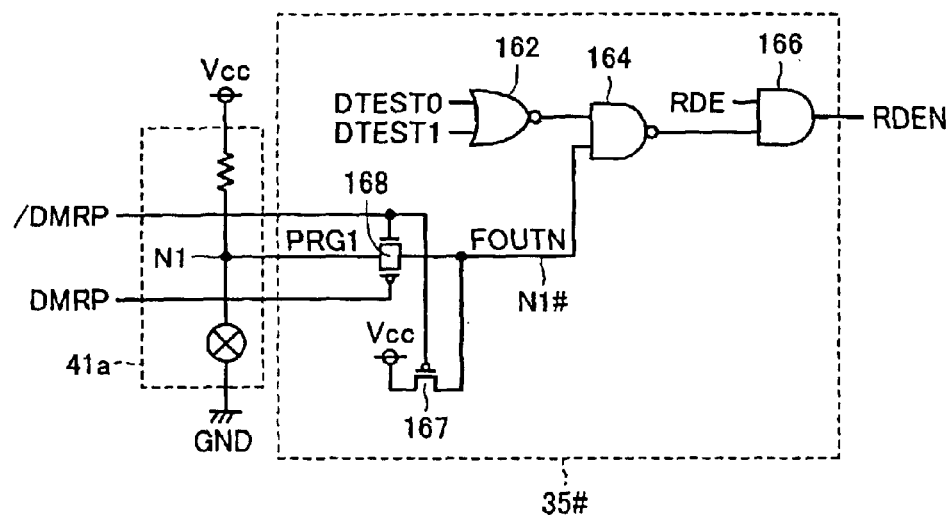
FIG. 17 is a first circuit diagram showing a configuration of a replacement control unit according to a second embodiment.
Figure 18:
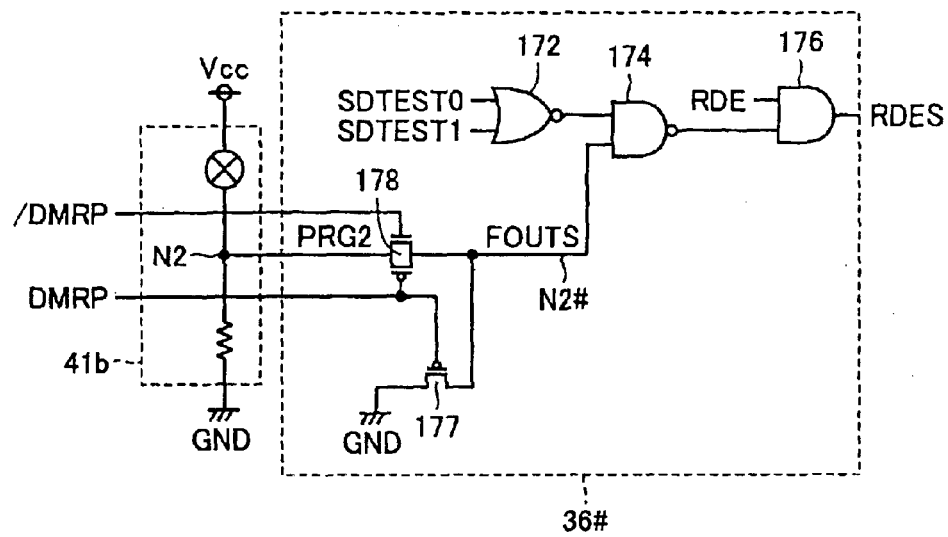
FIG. 18 is a second circuit diagram showing a configuration of a replacement control unit according to the second embodiment.

FIGS. 17 and 18 are circuit diagrams showing a configuration of a replacement control unit according to the second embodiment. FIG. 17 shows a configuration of a replacement control unit 35# generating control signal RDEN. FIG. 18 shows a configuration of a replacement control unit 36# generating control signal RDES.

In the MRAM device according to the second embodiment, replacement control units 35# and 36# shown in FIGS. 17 and 18 are provided in place of replacement control units 35 and 36 shown in FIGS. 11 and 12. The configuration and operation of other sections of the MRAM device is same with the device according to the first embodiment and the detailed description thereof will not be repeated.

With reference to FIG. 17, replacement control unit 35# is different from replacement control unit 35 shown in FIG. 11 in that it further includes a P-MOS transistor 167 and a transfer gate 168.

Transfer gate 168 is arranged between node N1 in programming unit 41a and a node N1# in replacement control unit 35#. Voltage on node N1# is supplied as signal FOUTN to logic gate 164. P-MOS transistor 167 is connected between power supply voltage Vcc and node N1#.

When dummy repair signal DMRP is set to an active state (H level), transfer gate 168 is turned off to electrically separate node N1 from node N1#. Further, P-MOS transistor 167 is turned on to connect node N1# to power supply voltage Vcc. Thus, signal FOUTN is set to an H level in the same manner as at the time the fuse element is blown in programming unit 41a.

On the other hand, when dummy repair signal DMRP is set to an inactive state (L level), P-MOS transistor 167 is turned off and transfer gate 168 is turned on. Hence, signal FOUTN is set according to programming signal PRG1, in other words, according to whether the fuse element in programming unit 41a has been blown or not.

Dummy repair signal DMRP can be externally input through an electrical contact. Other than the setting of signal FOUTN, the operation of replacement control unit 35# is same with that of replacement control unit 35 shown in FIG. 11 and the detailed description thereof will not be repeated.

With reference to FIG. 18, replacement control unit 36# is different from replacement control unit 36 shown in FIG. 12 in that it further includes a P-MOS transistor 177 and a transfer gate 178.

Transfer gate 178 is arranged between a node N2 in programming unit 41b and a node N2# in replacement control unit 36#. The voltage of node N2# is supplied as signal FOUTS to logic gate 174. P-MOS transistor 177 is connected between power supply voltage Vcc and node N2#.

When dummy repair signal DMRP is set to an active state (H level), transfer gate 178 is turned off to electrically separate node N2 from node N2#. Further, P-MOS transistor 177 is turned on to connect node N2# to power supply voltage Vcc. Thus, signal FOUTS is set to an H level in the same manner as at the time the fuse element is blown in programming unit 41b.

On the other hand, when dummy repair signal DMRP is set to an inactive state (L level), P-MOS transistor 177 is turned off and transfer gate 178 is turned on. Hence, signal FOUTS is set according to programming signal PRG2, in other words, according to whether the fuse element in programming unit 41b has been blown or not.

Other than the setting of signal FOUTS, the operation of replacement control unit 36# is same with that of replacement control unit 36 shown in FIG. 12 and the detailed description thereof will not be repeated.

Thus through the setting of dummy repair signal DMRP to an active state (H level), replacement control units 35#, 36# can be made to operate without actually blowing the fuse element in the same manner as at the time when the fuse element in the programming circuit has been blown.

Thus in the configuration according to the second embodiment, when at least one reference cell is detected to be defective through the reference cell test, dummy repair signal DMRP is set to an H level. Thus, it is possible to replace the reference cell with the spare cell by establishing a condition similar to that where the fuse elements are actually blown, without actually blowing the fuse elements in the programming circuit.

As a result, it is possible to move to the operation test of the regular memory cell after the test of the reference cell with the memory tester leaving the MRAM device on the memory tester and without performing the fuse blowing on the laser trimming apparatus. Thus, more effective operation test and the reduction of the process time are allowed.

Third Embodiment

In third embodiment, a test mode for the reference cell and the spare cell will be described in which, not like in the first embodiment, the reference cell and the spare cell have the similar configuration to the regular memory cell.

Figure 19:
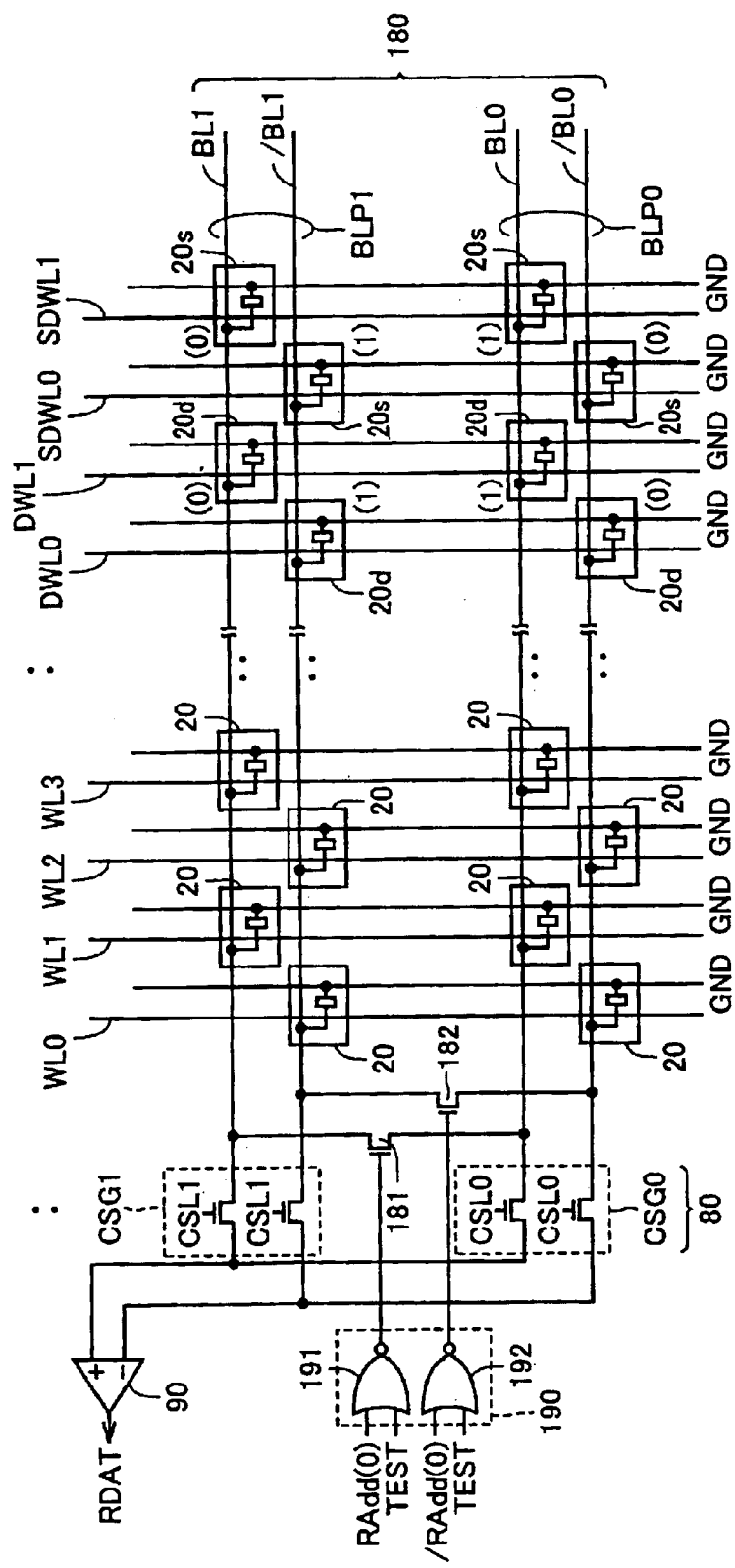
FIG. 19 is a circuit diagram illustrative of a configuration of a memory cell array according to a third embodiment.

In the configuration according to the third embodiment, every two bit line pairs BLP's form a group 180 for the generation of reference current. In FIG. 19, a configuration corresponding to bit line pairs BLP0 and BLP1 forming one representative of group 180 is shown. In the MRAM device according to the third embodiment, the configuration other than the memory cell array is changed from the configuration shown in FIG. 6 to the configuration shown in FIG. 19.

With reference to FIG. 19, reference cells 20d's and spare cells 20s's are alternately arranged in the same manner as reference cells 21's and spare cells 21#'s in FIG. 6 at intersections of bit lines BL, /BL and dummy word line DWL (collective representation of DWL0 and DWL1) and spare word line SDWL (collective representation of SDWL0 and SDWL1). With regard to the other sections the third embodiment is same with the first embodiment and the detailed description thereof will not be repeated.

Here, each of reference cells 20d's and spare cells 20s's according to the third embodiment has the same configuration with regular memory cell 20, in other words, the configuration shown in FIG. 3. Therefore, it is not necessary to arrange reference voltage line 25 (collective representation of 25-0, 25-1, 25#-0, 25#-1) for reference cell 20d and spare cell 20s. Further, the gate of access transistor 24 in reference cell 20d is connected to the corresponding dummy word line DWL and the gate of access transistor 24 in spare cell 20s is connected to spare word line SDWL. As the voltage levels of word line WL, dummy word line DWL and spare word line SDWL are the same (power supply voltage Vcc) at the time of their selection, the on-resistance of transistor 24 working as an access switch is at the same level in each of regular memory cell 20, reference cell 20d and spare cell 20s.

In each bit line pair BLP, data of complementary value are previously written into reference cell 20d and spare cell 20s connected to bit line BL and reference cell 20d and spare cell 20s connected to bit line /BL. Further, in a bit line pair forming the same group 180, data previously written into reference cell 20d and spare cell 20s connected to bit line is complementary with data previously written into reference cell 20d and spare cell 20s connected to bit line /BL.

Specifically, in bit line pairs BLP0 and BLP1 shown in FIG. 19, data "1" (H level) is previously written into reference cell 20d and spare cell 20sconnected to bit lines BL0 and /BL1 whereas data "0" (L level) is previously written into reference cell 20d and spare cell 20s connected to bit lines /BL0 and BL1.

A column select gate CSG is arranged between each bit line pair BLP and data reading amplifier 90. In FIG. 19, representative column select gates CSG0 and CSG1 corresponding to bit line pairs BLP0 and BLP1 are shown.

Column select gate CSG0 is formed with N-MOS transistors connected respectively between bit lines BL0 and /BL0 and the input node of data reading amplifier 90. To each gate of the N-MOS transistor, column select line CSG0 is connected. Thus, when the selected memory cell corresponds with bit line pair BLP0, bit lines BL0 and /BL0 are connected with data reading amplifier 90 in response to the selection of column select line CSG0. A similar configuration is provided for each bit line pair BLP. Here, column select gates CSG0, CSG1, . . . correspond with BL selector 80 in the first embodiment.

In the configuration according to the third embodiment, bit line switches 181 and 182 are provided for connecting bit lines BL's and /BL's of bit line pairs BLP's in the same group 180. In FIG. 19, representative bit line switches 181 and 182 are shown between bit line pairs BLP0 and BLP1. Such bit line switches 181 and 182 are provided in the same manner for every group 180 of bit line pairs.

Bit line switch control circuit 190 controls turning on and off of bit line switches 181 and 182. Bit line switch control circuit 190 includes a logic gate 191 controlling on/off of bit line switch 181 and a logic gate 192 controlling on/off of bit line switch 182.

Logic gate 191 supplies as an output the result of an NOR operation of test control signal TEST and address bit RAdd (0). Logic gate 192 supplies as an output the result of an NOR operation of an inverted address bit /RAdd (0) and test control signal TEST.

Here, test control signal TEST is set to an H level when the test of the reference cell or the spare cell is to be performed and set to an L level in the normal mode.

Bit line switch 181 includes an N-MOS transistor electrically connected between bit line BL0 and bit line BL1 and having a gate receiving an output of logic gate 191. Bit line switch 182 includes an N-MOS transistor electrically connected between bit line /BL0 and bit line /BL1 and having a gate receiving an output of logic gate 192.

With this configuration, in the normal data reading, one of bit lines switches 181 and 182 is turned on according to the selection of either an odd-numbered row or an even-numbered row. Specifically, when the even-numbered row is selected, bit line switch 181 is turned on such that a bit line BL connected to reference cell 20d to which "0" is previously written in and another bit line BL connected to reference cell 20d to which "1" is previously written in are connected. On the other hand, when the odd-numbered row is selected, bit line switch 182 is turned on such that a bit line /BL connected to reference cell 20d to which "0" is previously written in and another bit line /BL connected to reference cell 20d to which "1" is previously written in are connected.

Thus, the sum of passing currents Imax+Imin running through reference cell 20d which stores "0" and reference cell 20d which stores "1" is supplied to one input node of data reading amplifier 90. To another input node, memory cell current Imax or Imin by the selected memory cell is supplied.

When an element such as a current mirror amplifier is provided in data reading amplifier 90 to divide the current Imax+Imin by two, it is possible to acquire reference current Iref=(Imax+Imin)/2. Then, data reading amplifier 90 can perform data reading based on reference current Iref thus acquired and the memory cell current. A configuration is disclosed in FIG. 5 of above cited publication for generating a reference current by dividing by two the sum of passing currents running through two reference cells which previously store data of complementary values, and the cited publication is hereby incorporated by reference.

Figure 20:
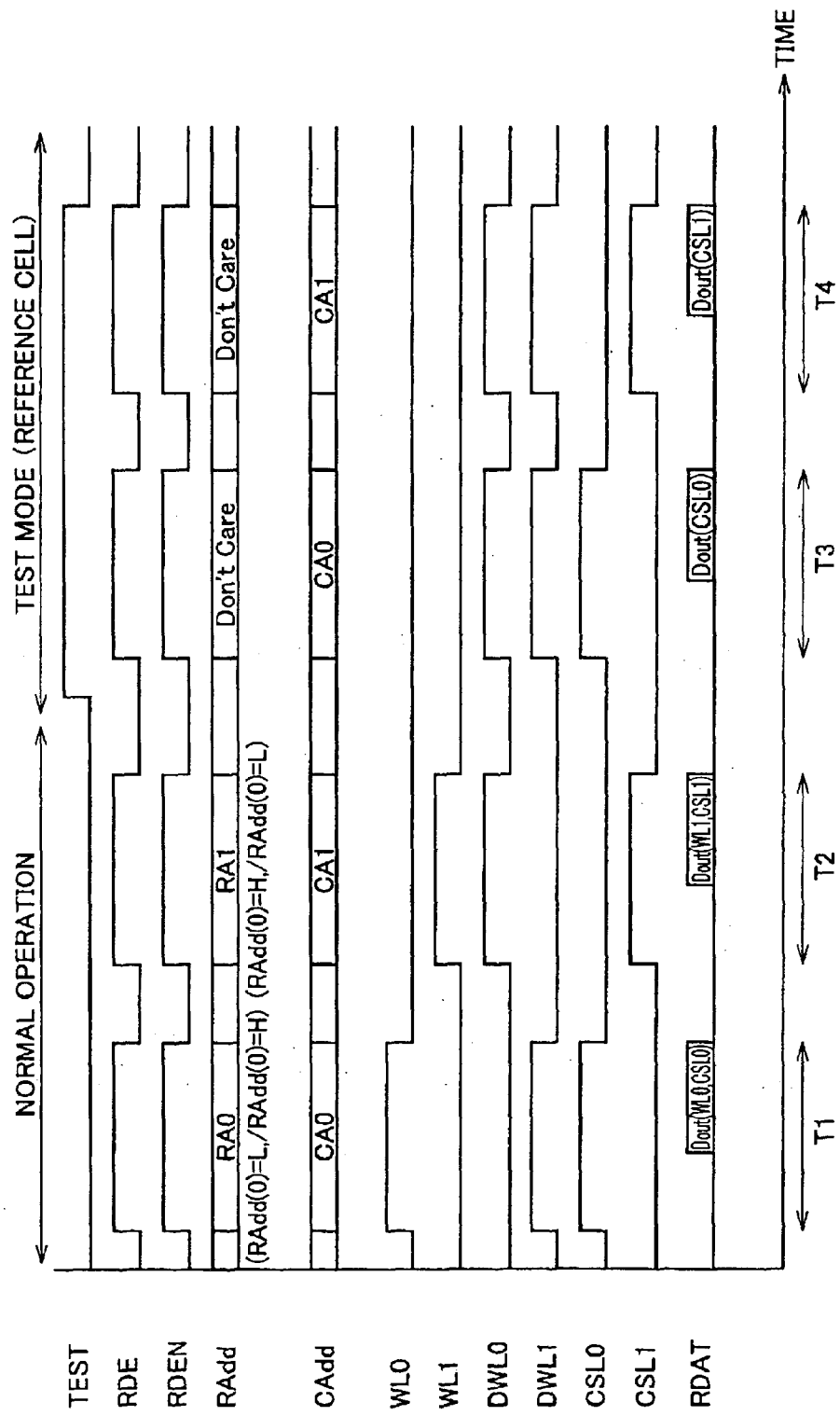
FIG. 20 is an operation waveform chart illustrative of operations in normal data reading and in a reference cell test mode of an MRAM device according to the third embodiment.

FIG. 20 shows an operation waveform chart illustrative of an operations in the normal data reading and the reference cell test mode in the MRAM device according to the third embodiment.

With reference to FIG. 20, for time periods T1 and T2, an operation waveform at the time of normal data reading (normal operation) similar to that shown in FIG. 16 is shown.

During time period T1, the normal data reading from the selected memory cell connected to word line WL0 and bit line /BL0 is performed according to row address RA0 and column address CA0. Similarly, during time period T2, the normal data reading from the selected memory cell connected to word line WL1 and bit line BL1 is performed according to row address RA1 and column address CA1.

The details of the operation during time periods T1 and T2 are same with those during time periods T1 and T2 of FIG. 16 except the generation of reference current Iref described in connection with FIG. 19 and the detailed description thereof will not be repeated.

During time periods T3 and T4, test control signal TEST is activated to an H level and the operation is performed in the reference cell test mode. In the configuration according to the third embodiment, reference cell 20d (or spare cell 20s) connected to complementary bit lines BL, /BL, respectively, in each bit line pair BLP, previously store complementary data. Hence, it is not necessary to distinguish test control signals DTEST1 from DTEST0 and test control signals SDTEST1 from SDTEST0. In other words, in the configuration according to the third embodiment, two test patterns exist, that is, the reference cell test mode and the spare cell test mode.

In time period T3, control signal RDEN is set to an active state (H level) according to the time period during which control signal RDE is in an active state (H level) as in the test pattern i), ii) in the first embodiment. On the other hand, though not shown, control signal RDES is fixed to an L level.

Further, each word line WL corresponding to the regular memory cell is fixed to a non-select state (L level) and each of dummy word lines DWL0 and DWL1 is selected, whereby reference cell 20d is connected to each of bit lines BL and /BL in each bit line pair BLP.

In this state, bit lines BL0, /BL0 are connected to data reading amplifier 90 according to column address CA0 supplied as an input. Thus, two reference cells 20d's connected to dummy word line DWL and bit lines BL0, /BL0 are connected to data reading amplifier 90 as an object of the test.

As described above, bit line switches 181 and 182 shown in FIG. 19 are turned off in the test mode. Thus, data reading amplifier 90 generates read data RDAT based on the difference of passing currents of bit lines BL0 and /BL0, in other words, the difference of passing currents of two reference cells 20d's as the objects of the test.

Thus acquired read data RDAT is checked to find whether it properly corresponds with complementary data previously written into two reference cells 20d's, which is the objects of the test, whereby it is determined whether reference cells 20d's as the objects of the test are normal or defective.

In time period T4, the column address is switched from CA0 to CA1 and the spare cell test similar to that in time period T3 is performed. Thus, in time period T4, the test result about reference cells 20d's corresponding to bit lines BL1, /BL1 and dummy word line DWL can be acquired.

Further, if the setting of test control signals DTEST0, DTEST1, SDTEST0, SDTEST1 are exchanged to select spare word lines SDWL0 and SDWL1 instead of dummy word lines DWL0 and DWL1 in time periods T3 and T4, it is possible to check whether each spare cell 20s is normal or defective in the same manner as for reference cell 20d.

Thus in the configuration according to the third embodiment, even when reference cell 20d and spare cell 20s have the same configuration as regular memory cell 20, it is possible to test whether each of the reference cell and the spare cell themselves is defective or not in the same manner as in the first embodiment. Thus, an effective replacement can be performed when a plurality of reference cells become defective.

Variation of Third Embodiment

In the configuration according to the third embodiment, as regular memory cell 20 and reference cell 20d have the same configuration, it is possible to perform the replacement for both reference cell 20d and regular memory cell 20 using spare cell 20s arranged as to form a row of spare cells.

In a variation of third embodiment, a row selection which allows such replacement will be described.

FIGS. 21A–21C each shows a selection control for word line WL, dummy word line DWL and spare word line SDWL.

With reference to FIG. 21A, when both regular memory cell 20 and reference cell 20d are not defective, as the replacement with spare cell 20s, in other words the selection of spare word lines SDWL0 and SDWL1 is not necessary, each of spare word lines SDWL0 and SDWL1 is turned to a non-select state at the time of even-numbered row selection (RAdd (0)="0") and at the time of odd-numbered row selection (RAdd (0)="1").

With regard to word line WL and dummy word lines DWL0 and DWL1, at the time of even-numbered row selection, a word line in an even-numbered row corresponding to the selected memory cell is selected and dummy word line DWL1 is selected. Word line WL in a non-selected row and dummy word line DWL0 are turned to a non-select state. On the other hand, at the time of odd-numbered row selection, a word line of an odd-numbered row corresponding to the selected memory cell is selected and dummy word line DWL0 is selected. Word line WL in a non-selected row and dummy word line DWL1 are turned into a non-select state.

With reference to FIG. 21B, when a regular memory cell is defective, a defective address corresponding to the defective memory cell is programmed and if the defective address matches with a row address supplied as an input, a corresponding defective word line is turned to a non-select state. When the row address supplied as an input does not match with the defective address, each word line WL is selected in the same manner as described in connection with FIG. 21A.

The selection and non-selection of dummy word lines DWL0 and DWL1 are set in the same manner as described in connection with FIG. 21A.

With regard to spare word lines SDWL0 and SDWL1, at the time of defective word line selection, if the defective word line corresponds with an even-numbered row, spare word line SDWL0 is selected and spare word line SDWL1 is turned to a non-select state. On the other hand, if the defective word line corresponds with an odd-numbered row, spare word line SDWL1 is selected and spare word line SDWL0 is turned to a non-select state.

Here, if a word line WL other than the defective word line is selected, each of spare word lines SDWL0 and SDWL1 is turned to a non-select state as in FIG. 21A.

In FIG. 21C, a case is shown in which at least one reference cell 20d is defective and reference cells 20d's as a whole are replaced with spare cells 20s's.

In this case, the selection and the non-selection of each word line WL corresponding to the regular memory cell are set in the same manner as described in connection with FIG. 21A. Here, as reference cells 20d's as a whole is replaced with spare cells 20s's and the activation of reference cell 20d is not necessary, dummy word lines DWL0 and DWL1 are turned to a non-select state both at the time of odd-numbered row selection and even-numbered row selection.

The selection and the non-selection of spare word lines SDWL0 and SDWL1 are set in the same manner as for dummy word lines DWL0 and DWL1 in FIG. 21B, in order to connect spare cell 20s with bit lines BL, /BL as for reference cell 20d in the normal operation.

Through the selection and non-selection of word line WL, dummy word line DWL and spare word line SDWL, both regular memory cell 20 and reference cell 20d arranged to form a row of reference cells are made replaceable with spare cell 20s arranged to form a row of spare cells.

Next, a configuration which allows such control of word line WL, dummy word line DWL and spare word line SDWL will be described.

Figure 22:
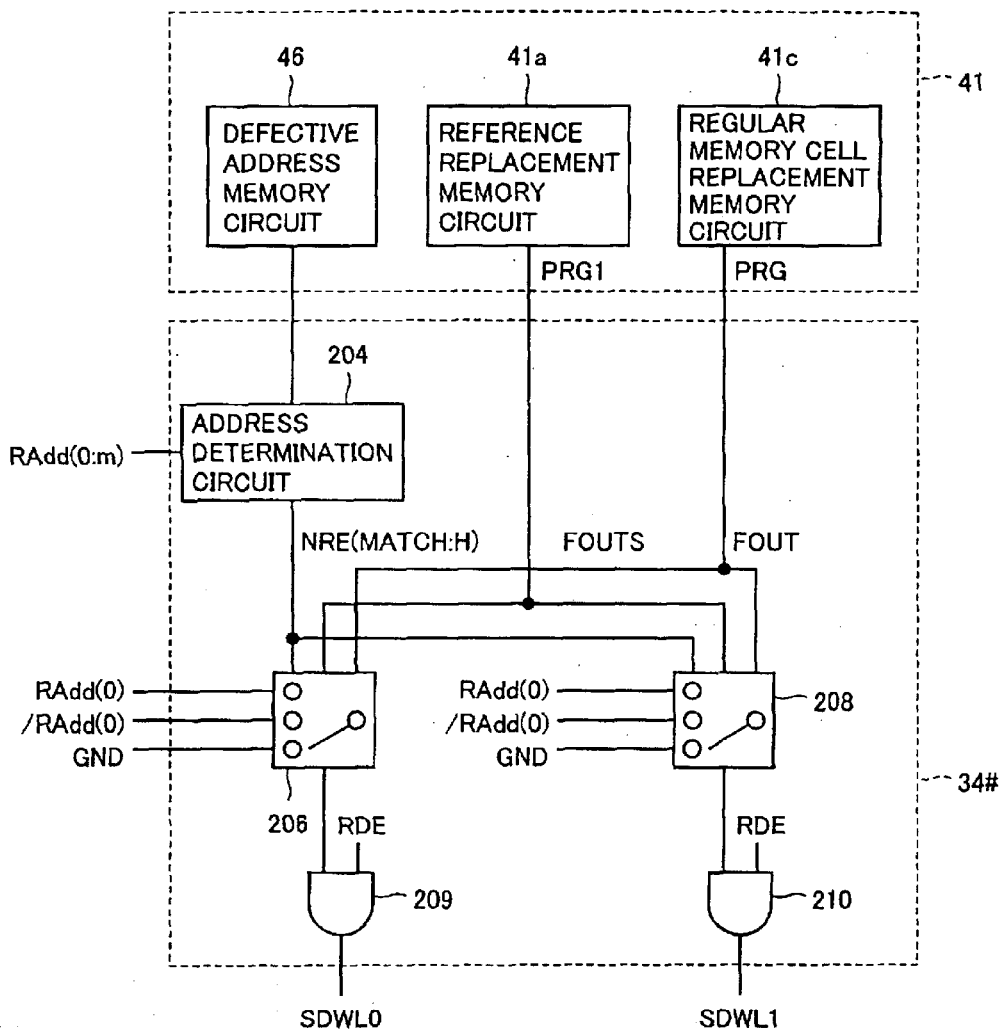
FIG. 22 is a circuit diagram showing a configuration of a spare word line control unit according to the third embodiment.

FIG. 22 is a circuit diagram showing a configuration of spare word line control unit 34# according to the third embodiment.

With reference to FIG. 22, programming circuit 41 includes a reference replacement memory circuit 41a corresponding to programming unit 41a, a regular memory cell replacement memory circuit 41c, and a defective address memory circuit 46 storing a defective address corresponding to a defective word line (defective memory cell). Regular memory cell replacement memory circuit 41c has the same configuration as programming unit 41a shown in FIGS. 11 and 12 and a fuse element (not shown) included therein is blown at the time of regular memory cell replacement. The level of programming signal PRG changes in the fixed manner in response to the blow of fuse element in the same manner as programming signal PRG1.

Signals FOUTS and FOUT are set to the same level as programming signal PRG1 supplied from reference replacement memory circuit 41a and programming signal PRG supplied from regular memory cell replacement memory circuit 41c, respectively. Defective address memory circuit 46 fixedly stores address bit RAdd (0:m) indicating a defective address.

Spare word line control unit 34# has an address determination circuit 204, logic switching circuits 206 and 208 and logic gates 209 and 210. Address determination circuit 204 receives address bit RAdd (0:m) constituting an input address indicating an object of the access and determines whether the address matches with a defective address stored in defective address memory circuit 46. When two match, output signal NRE of address determination circuit 204 is set to an H level and when two do not match, signal NRE is set to an L level.

Each of logic switching circuits 206 and 208 determines whether the case corresponds with either of FIGS. 21A–21C according to signals NRE, FOUT, FOUTS and supplies as an output one of address bit RAdd (0), inverted address bit /RAdd (0) and ground voltage GND.

Logic gate 209 drives spare word line SDWL0 with a voltage corresponding to the result of an AND operation of the output of logic switching circuit 206 and control signal RDE. Similarly, logic gate 210 drives spare word line SDWL1 with a voltage corresponding to the result of an AND operation of the output of logic switching circuit 208 and control signal RDE.

When signals FOUT and FOUTS are both at an L level, each of logic switching circuits 206 and 208 recognize that there is no defect in regular memory cell 20 and reference cell 20d and supplies as an output ground voltage GND. As a result, the output of logic gates 209 and 210 are fixed to an L level and spare word lines SDWL0 and SDWL1 are set to a non-select state (L level). This corresponds with the operation shown in FIG. 21A.

Further, when signal FOUT is set to an H level, the replacement of the regular memory cell is necessary and the operation corresponding to FIG. 21B must be performed. Hence, when it is determined that a defective word line is selected through output signal NRE provided from address determination circuit 204, logic switching circuit 206 supplies as an output an inverted bit /RAdd (0) and logic switching circuit 208 supplies as an output address bit RAdd (0).

On the other hand, even if signal FOUT attains an H level, if signal NRE is at an L level, in other words, the input address does not match with the defective address, the same operation as in FIG. 21A must be performed and each of logic switching circuits 206 and 208 supplies ground voltage GND as an output.

When the replacement of defective reference cell 20d is programmed, the operation corresponding to FIG. 2C must be performed. In this case, signal FOUTS is set to an H level, and in response to signal FOUTS, logic switching circuit 206 supplies as an output address bit RAdd (0) and logic switching circuit 208 supplies as an output an inverted bit /RAdd (0).

Thus, as described in connection with FIGS. 21A–21C, the selection and the non-selection of spare word lines SDWL0 and SDWL1 can be controlled.

Here, the selection and the non-selection of dummy word lines DWL0 and DWL1 shown in FIGS. 21A–21C can be implemented according to the configuration according to the first embodiment, whereby detailed description thereof will not be repeated.

The selection of each word line WL can be performed by providing a configuration where an inverted signal of signal NRE shown in FIG. 22 is supplied as an input to logic gate 108-0 in word line control unit 32 shown in FIG. 7, whereby each word line WL is controlled according to the result of a four input AND logic operation.

In brief, in the MRAM device according to the variation of the third embodiment, spare word line control unit 34 is replaced with spare word line control unit 34# shown in FIG. 22 and a modification as described above is added to word line control unit 32. The configuration and the operation of other units are same with the third embodiment and the detailed description thereof will not be repeated.

As described above, in the configuration according to the variation of the third embodiment, in addition to the effect provided by the MRAM device according to the third embodiment, it becomes possible to replace both regular memory cell 20 and reference cell 20d with spare cell 20s. As a result, a more effective replacement with the spare cell can be implemented.

Here, it is possible to provide a configuration which allows pseudo fuse-blown state through the application of the replacement control unit according to the second embodiment to the variation of the third embodiment and to the third embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetic memory device comprising:
a plurality of word lines and a plurality of dummy word lines arranged along a same direction;
a plurality of bit line pairs each formed with a first and second bit lines arranged in a direction perpendicular to the direction of said plurality of word lines and said plurality of dummy word lines;
a plurality of magnetic memory cells alternately arranged at intersections of said plurality of word lines and said first and second bit lines, and electrically connected with the corresponding first or second bit line in response to a selection of the corresponding word line;
a plurality of magnetic reference cells alternately arranged at intersections of said plurality of dummy word lines and said first and second bit lines, and electrically connected to the corresponding said first or second bit line in response to a selection of the corresponding dummy word line;
a data reading circuit performing a data reading based on a passing current of said first and second bit lines forming same said bit line pair; and
a row select unit controlling a selection of said plurality of word lines and said plurality of dummy word lines according to an address signal,
wherein said row select unit selects one of said plurality of word lines and one of said plurality of dummy word lines in a normal data reading such that said first and second bit lines forming each of said bit line pairs are connected to one of said plurality of magnetic memory cells and one of said plurality of magnetic reference cells, respectively, and sets each of said plurality of word lines to a non-select state and at the same time selects said plurality of dummy word lines in a first test mode such that said first and second bit lines forming each of said bit line pairs are connected to two of said plurality of magnetic reference cells, respectively.

2. The magnetic memory device according to claim 1, wherein each of said plurality of magnetic memory cells includes a first magneto-resistance element set to one of a high resistance state and a low resistance state according to magnetically written-in data and a first access switch rendered conductive with a first resistance value as an on resistance in response to selection of said corresponding word line, said first magneto-resistance element and said first access switch being connected in series between said corresponding first or second bit line and a predetermined voltage, each of said plurality of reference cells includes a second access switch and a second magneto-resistive element having a resistance similar to that of said first magneto-resistive element connected in series between said corresponding first or second bit line and the predetermined voltage, said second access switch being rendered conductive in response to a selection of said corresponding dummy word line, said magnetic memory device further comprising a resistance control unit controlling an on resistance of said second access switch in a conductive state, said resistance control unit controls the on resistance of said second access switch in the conductive state to a second resistance value for each of said plurality of magnetic reference cells in said normal data reading, and controls the on resistance of said second access switch to said second resistance value and a resistance value different from said second resistance value for one and the other of two of said magnetic reference cells connected to said first and second bit lines, respectively, in said first test mode, and a sum of a resistance value of said second magneto-resistance element and said second resistance value is at an intermediate level of a sum of a resistance value of said each of first and second magneto-resistance element in said low resistance state and said first resistance value and a sum of a resistance value of each of said first and second magneto-resistance element in said high resistance state and said first resistance value.

3. The magnetic memory device according to claim 2, wherein said resistance control unit controls the on resistance of the second access switches in the conductive state to one and the other of said first and second resistance values respectively, in said two of said magnetic reference cells connected to said first and second bit lines respectively in said first test mode.

4. The magnetic memory device according to claim 2, wherein said first access switch includes a first field effect transistor connected in series with said first magneto-resistance element between said corresponding first or second bit line and said predetermined voltage and having a gate connected to said corresponding word line, said second access switch includes second and third field effect transistors connected in series with said second magneto-resistance element between said corresponding first or second bit line and said predetermined voltage, said second field effect transistor has a gate connected to said corresponding dummy word line, and said third field effect transistor has a gate receiving an input of reference voltage controlled by said resistance control unit.

5. The magnetic memory device according to claim 1, wherein a cell resistance of each of said plurality of magnetic memory cells changes according to a level of magnetically written-in data, each of said plurality of magnetic reference cells has a same configuration as each of said plurality of magnetic memory cells, in each of said bit line pairs, to each of said magnetic reference cells connected to said first bit line and to each of said magnetic reference cells connected to said second bit line, said data are previously written in at complementary levels, respectively, said magnetic memory device further comprises a first switch for connecting each of said first bit lines to another said first bit line corresponding to other said bit line pair, a second switch for connecting each of said second bit lines to another said second bit line corresponding to other said bit line pair, and a switching control unit controlling on and off of said first and second switches, wherein to said magnetic reference cells corresponding to two said first bit lines connectable with said first switch, said data are previously written in at complementary levels, respectively, to said magnetic reference cells corresponding to two said second bit lines connectable with said second switch, said data are previously written in at complementary levels, respectively, said switching control unit turns said first switch off and turns said second switch on when a selected memory cell is connected to said first bit line and turns said first switch on and turns said second switch off when said selected memory cell is connected to said second bit line in said normal data reading, and turns each of said first and second switches off in said first test mode.

6. The magnetic memory device according to claim 5, comprising a plurality of spare word lines arranged along the same direction with the direction of said plurality of word lines and plurality of dummy word lines, and a plurality of magnetic spare cells each having the same configuration as each of said plurality of magnetic memory cells, wherein said plurality of magnetic spare cells are arranged alternately at intersections of said plurality of spare word lines and said first and second bit lines, and electrically connected to corresponding said first or second bit line in response to a selection of the corresponding spare word line, said row select unit further controls a selection of said plurality of spare word lines and selects one of said plurality of spare word lines instead of the word line to be selected when the magnetic memory cell corresponding to the word line to be selected is defective in said normal data reading and selects one of said plurality of spare word lines instead of the dummy word line to be selected when the magnetic reference cell corresponding to said dummy word line to be selected is defective, and when there is a defect in said plurality of reference cells, said data are previously written into said plurality of magnetic spare cells in a same manner with said plurality of reference cells.

7. The magnetic memory device according to claim 6, wherein said row select unit turns each of said plurality of word lines and said plurality of dummy word lines into a non-select state and selects said plurality of spare word lines such that said first and second bit lines forming each of said bit line pairs are connected to two of said plurality of magnetic spare cells in a second test mode.

8. The magnetic memory device according to claim 6, wherein each of said plurality of magnetic memory cells includes a first magneto-resistance element having a resistance varied according to magnetically written in data and a first access switch rendered conductive in response to a selection of said corresponding word line, said magneto-resistance element and said first access switch being connected in series between said corresponding first or second bit line and a predetermined voltage, each of said plurality of magnetic dummy cells includes a second access switch rendered conductive in response to a selection of said corresponding dummy word line and a second magneto-resistance element having a resistance similar to that of said first magneto-resistance element, said second access switch and said second magneto-resistance element being connected in series between said corresponding first or second bit line and the predetermined voltage and, each of said plurality of magnetic spare cells includes a third access switch render conductive in response to a selection of said corresponding spare word line and a third magneto-resistance element having a resistance similar to that of said first magneto-resistance element, said third access switch and said third magneto-resistance element being connected in series between said corresponding first or second bit line and the predetermined voltage and, and resistance values of said first, second and third access switches in a conductive state are substantially equal.

9. The magnetic memory device according to claim 1, further comprising a plurality of spare word lines arranged along the same direction with the direction of said plurality of word lines and said plurality of dummy word lines, and a plurality of magnetic spare cells to be replaced with said plurality of magnetic reference cells, wherein said plurality of magnetic spare cells are alternately arranged at intersections of said plurality of spare word lines and said first and second bit lines, and electrically connected to corresponding said first or second bit line in response to a selection of the corresponding spare word line, and said row select unit further controls a selection of said plurality of spare word lines and turns each of said plurality of word lines and said plurality of dummy word lines to a non-select state and selects said plurality of spare word lines such that said first and second bit lines forming each of said bit line pairs are connected to two of said plurality of magnetic spare cells, respectively, in a second test mode.

10. The magnetic memory device according to claim 9, further comprising a programming circuit including a programming element fixedly storing information in response to an external input and supplying a programming signal as an output corresponding to an existence of said external input to said programming element, wherein said row select unit selects one of said plurality of spare word lines instead of the dummy word line to be selected when there is a defect in said magnetic reference cells, and said row select unit determines whether there is a defect in said magnetic reference cells or not based on said programming signal in said normal data reading and based on an externally supplied electrical signal in a third test mode.

* * * * *